(12) United States Patent
Iwane et al.

(10) Patent No.: US 12,538,651 B2
(45) Date of Patent: Jan. 27, 2026

(54) DISPLAY DEVICE, EYEGLASSES, CAMERA, AND METHOD OF MANUFACTURING DISPLAY DEVICE

(71) Applicant: CANON KABUSHIKI KAISHA, Tokyo (JP)

(72) Inventors: Masaaki Iwane, Kanagawa (JP); Shoji Kono, Tokyo (JP); Shusuke Yanagawa, Kanagawa (JP); Yoshiaki Miyamoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 687 days.

(21) Appl. No.: 17/950,154

(22) Filed: Sep. 22, 2022

(65) Prior Publication Data

US 2023/0099575 A1    Mar. 30, 2023

(30) Foreign Application Priority Data

Sep. 24, 2021 (JP) .................... 2021-155255

(51) Int. Cl.
| | |
|---|---|
| *H10K 59/121* | (2023.01) |
| *G02B 27/01* | (2006.01) |
| *H01L 23/00* | (2006.01) |
| *H01L 25/065* | (2023.01) |
| *H04N 23/53* | (2023.01) |
| *H10K 59/12* | (2023.01) |
| *H10K 59/127* | (2023.01) |
| *H10K 59/38* | (2023.01) |

(Continued)

(52) U.S. Cl.
CPC ....... *H10K 59/121* (2023.02); *G02B 27/0172* (2013.01); *H01L 24/05* (2013.01); *H01L 24/08* (2013.01); *H01L 25/0657* (2013.01); *H04N 23/53* (2023.01); *H10K 59/1275* (2023.02); *H10K 71/00* (2023.02); *H10K 77/10* (2023.02); *G02B 2027/0178* (2013.01); *H01L 2224/05624* (2013.01); *H01L 2224/05647* (2013.01); *H01L 2224/05684* (2013.01); *H01L 2224/08145* (2013.01); *H10K 59/1201* (2023.02); *H10K 59/38* (2023.02)

(58) Field of Classification Search
CPC .. H10K 59/121; H10K 59/1275; H10K 71/00; H10K 77/10; H10K 59/1201; H10K 59/38; G02B 27/0172; G02B 2027/0178; H01L 24/05; H01L 24/08; H01L 25/0657; H01L 2224/05624; H01L 2224/05647; H01L 2224/05684; H01L 2224/08145; H04N 23/53
See application file for complete search history.

(56) References Cited

U.S. PATENT DOCUMENTS

| | | |
|---|---|---|
| 6,140,985 A | 10/2000 | Kanai et al. |
| 2010/0208117 A1* | 8/2010 | Shintani ............... H04N 23/611 348/311 |

(Continued)

*Primary Examiner* — Thanh T Nguyen
(74) *Attorney, Agent, or Firm* — Venable LLP

(57) ABSTRACT

A display device according to the present invention, includes: a first substrate including a first single-crystal semiconductor substrate provided with a plurality of light emitting portions and with a first drive circuit that drives the plurality of light emitting portions, wherein the first single-crystal semiconductor substrate includes a plurality of light guiding portions that transmit light so as to implement a see-through function.

20 Claims, 18 Drawing Sheets

(51) Int. Cl.
*H10K 71/00* (2023.01)
*H10K 77/10* (2023.01)

(56) References Cited

U.S. PATENT DOCUMENTS

| | | |
|---|---|---|
| 2016/0133680 A1 | 5/2016 | Lee et al. |
| 2019/0043910 A1* | 2/2019 | Miyazawa .............. H01L 25/18 |

* cited by examiner

☐ 11T LIGHT TRANSMITTING PORTION   ▨ 11G GREEN LIGHT EMITTING PORTION
▦ 11R RED LIGHT EMITTING PORTION   ▦ 11B BLUE LIGHT EMITTING PORTION

DISPLAY DEVICE, EYEGLASSES, CAMERA, AND METHOD OF MANUFACTURING DISPLAY DEVICE

BACKGROUND OF THE INVENTION

Field of the Invention

The present invention relates to a display device, eyeglasses, a camera, and a method of manufacturing the display device.

Description of the Related Art

The specification of U.S. Patent No. 2016/0133680 (hereinafter PTL 1) discloses a see-through self-luminous display device.

PTL 1 discloses formation of a circuit including a thin-film transistor (TFT) as a drive circuit for a self-luminous element on a transparent substrate. Materials for an active layer of the TFT include polysilicon and a semiconductor oxide such as IGZO.

However, compared to a MOS transistor formed in a single-crystal silicon substrate, the TFT (the active layer of the TFT) has disadvantages such as inability to be miniaturized, a low carrier mobility, a large leakage current during an OFF period. Therefore, a display device using the TFT is not suitable for a higher definition, a higher speed, lower power consumption, and higher functionality.

SUMMARY OF THE INVENTION

The present invention provides a see-through display device which allows pixel miniaturization, another device (such as eyeglasses or a camera) including the display device, and a method of manufacturing the display device.

The present invention in its first aspect provides a display device including: a first substrate including a first single-crystal semiconductor substrate provided with a plurality of light emitting portions and with a first drive circuit that drives the plurality of light emitting portions, wherein the first single-crystal semiconductor substrate includes a plurality of light guiding portions that transmit light so as to implement a see-through function.

Further features of the present invention will become apparent from the following description of exemplary embodiments with reference to the attached drawings.

DESCRIPTION OF THE EMBODIMENTS

First Embodiment

A description will be given hereinbelow of a first embodiment of the present invention. A display device according to the first embodiment is a self-luminous display device, which is an organic light emitting display device (display) including, e.g., an organic light emitting diode. The display device according to the first embodiment has an optical see-through function of transmitting external light.

Figure 1A:
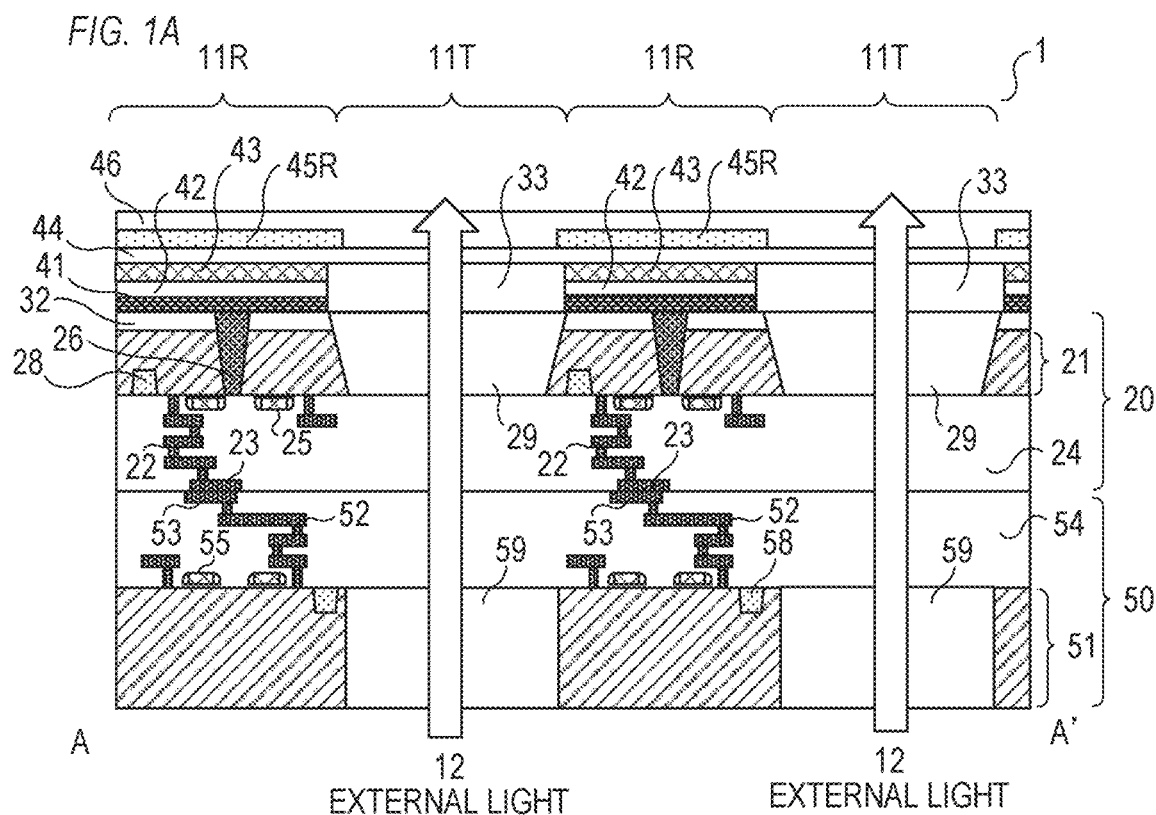
FIG. 1A is an example of a cross-sectional view of a display device according to a first embodiment.
Figure 1B:
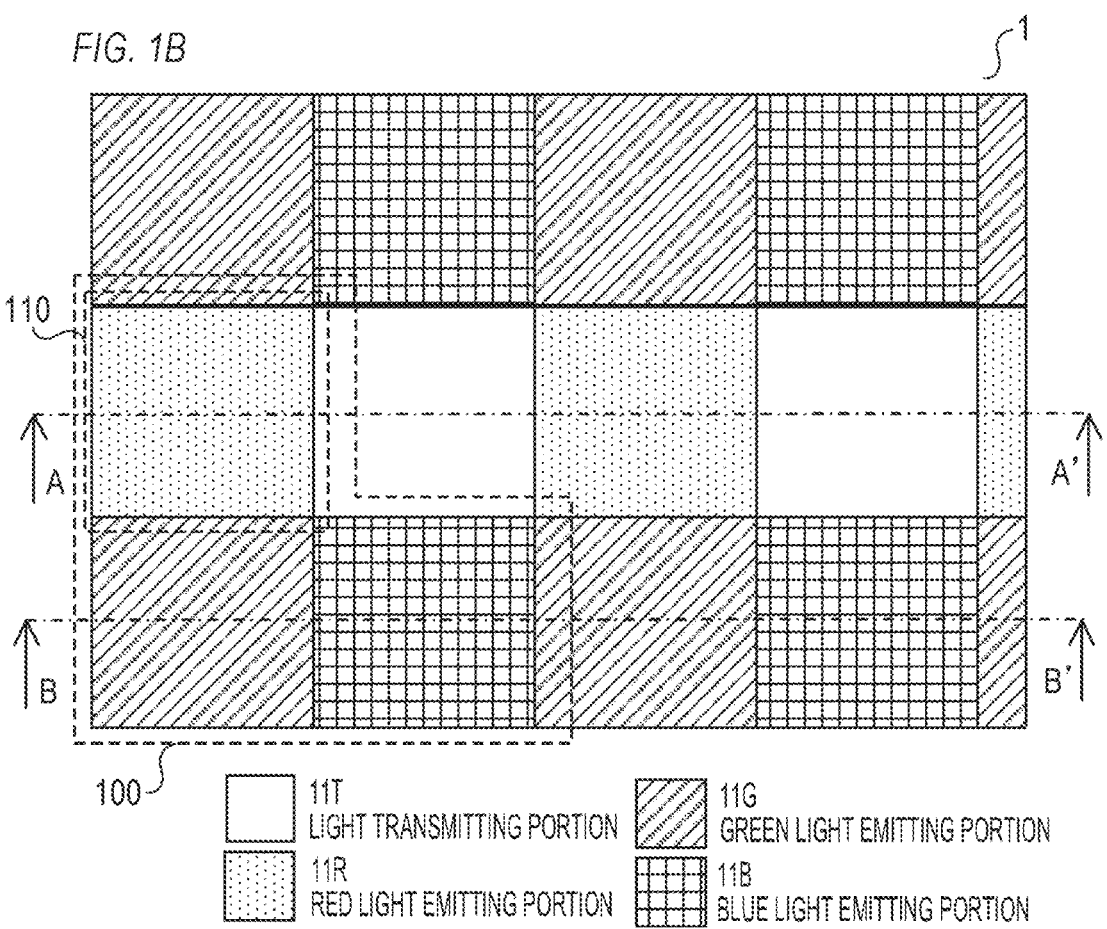
FIG. 1B is an example of a plan view of the display device according to the first embodiment.

FIG. 1A is a cross-sectional view of a display device 1 according to the first embodiment. FIG. 1B is a plan view of the display device 1. As illustrated in FIG. 1A, the display device 1 has a structure obtained by bonding together a first substrate 20 provided with a plurality of light emitting portions and a second substrate 50.

FIG. 1B is the plan view obtained by viewing a part of the display device 1 from a light emitting portion side. The display device 1 includes a plurality of pixels 100 and a plurality of light transmitting portions 11T that transmit light from a back surface of the display device 1 to a front surface thereof. The front surface is a surface on the light emitting portion side, while the back surface is a surface opposite to the front surface. The display device 1 is a color display device, and each one of the pixels 100 includes three sub-pixels 110 individually corresponding to three colors of red, blue, and green. A red light emitting portion 11R corresponding to a light emitting portion that emits red light serves as the red sub-pixel 110, a green light emitting portion 11G corresponding to a light emitting portion that emits green light serves as the green sub-pixel 110, and a blue light emitting portion 11B corresponding to a light emitting portion that emits blue light serves as the blue sub-pixel 110. The display device 1 includes the plurality of pixels 100 arranged in a matrix arrangement including several thousands of rows and several thousands of columns, and includes the plurality of light transmitting portions 11T arranged in a matrix arrangement including several thousands of rows and several thousands of columns so as to correspond to the plurality of pixels 100 on a one-to-one basis.

Note that the numbers of the pixels 100 and the light transmitting portions 11T are not particularly limited. It may also be possible to arrange the two or more light transmitting portions 11T for the one pixel 100 or arrange the one light transmitting portion 11T for the two or more pixels 100. The number of the light emitting portions (sub-pixels 110) to be included in one pixel may be larger or smaller than 3, and the colors of light beams emitted from the light emitting portions to be included in one pixel are not particularly limited. The display device 1 may also be a monochrome display device and, in that case, one light emitting portion may also be included in one pixel.

FIG. 1A is a cross-sectional view along a line A-A' portion in FIG. 1B. The first substrate 20 includes a first semiconductor substrate 21 and, in a back surface of the first semiconductor substrate 21, metal wiring 22, bonding metal wiring 23, and a gate electrode 25 of a MOS transistor are formed. The back surface of the first semiconductor substrate 21 is a surface caused to face the second substrate 50, which is the lower surface in FIG. 1A. In the back surface of the first semiconductor substrate 21, an interlayer insulating film 24 is formed so as to fill a space between the metal wiring 22, the bonding metal wiring 23, and the gate electrode 25. Additionally, in the back surface of the first semiconductor substrate 21, a STI (Shallow Trench Isolation) 28 is formed to isolate the MOS transistor including the gate electrode 25.

The second substrate 50 includes a second semiconductor substrate 51 and, in a front surface of the second semiconductor substrate 51, metal wiring 52, bonding metal wiring 53, and a gate electrode 55 of a MOS transistor are formed. The front surface of the second semiconductor substrate 51 is a surface caused to face the first substrate 20, which is the upper surface in FIG. 1A. In the front surface of the second semiconductor substrate 51, an interlayer insulating film 54 is formed so as to fill a space between the metal wiring 52, the bonding metal wiring 53, and the gate electrode 55. Additionally, in the front surface of the second semiconductor substrate 51, a STI 58 is formed to isolate the MOS transistor including the gate electrode 55.

Each of the first semiconductor substrate 21 and the second semiconductor substrate 51 is a single-crystal semiconductor substrate. Each of the first semiconductor substrate 21 and the second semiconductor substrate 51 is preferably a single-crystal silicon substrate. Examples of materials to be used for the metal wirings 22 and 52 include copper (Cu), tungsten (W), aluminum (Al), and the like. Examples of materials to be used for the bonding metal wirings 23 and 53 also include copper (Cu), tungsten (W), aluminum (Al), and the like. Each of the MOS transistor including the gate electrode 25 and the MOS transistor including the gate electrode 55 is a MOS transistor formed by a typical CMOS process. Each of the interlayer insulating films 24 and 54 is a transparent film made of a silicon oxide or the like.

By bonding together the first substrate 20 and the second substrate 50, the bonding metal wiring 23 and the bonding metal wiring 53 are electrically connected. The bonding metal wiring 23 and the bonding metal wiring 53 are electrically connected by metal bonding such as, e.g., Cu—Cu bonding. The metal bonding may also be metal diffusion bonding. The metal bonding strengthens the bonding between the first substrate 20 and the second substrate 50.

On a front surface of the first semiconductor substrate 21, an insulating film 32 is stacked. The front surface of the first semiconductor substrate 21 is a surface opposite to the back surface of the first semiconductor substrate 21, which is the upper surface in FIG. 1A. On an upper side of the insulating film 32, a lower electrode 41, an organic EL film 42, and an upper electrode 43 are arranged. In other words, the red light emitting portion 11R including the lower electrode 41, the organic EL film 42, the upper electrode 43, and a color filter 45R described later is provided with the insulating film 32 being interposed between the red light emitting portion 11R and the first semiconductor substrate 21. The lower electrode 41 is an electrode formed of a metal such as Cu, while the upper electrode 43 is a transparent electrode that transmits light. The lower electrode 41, the organic EL film 42, and the upper electrode 43 are included in an organic light emitting diode (OLED). The lower electrode 41 serves as an anode of the OLED, while the upper electrode 43 serves as a cathode of the OLED.

On an upper side of the upper electrode 43, the red color film 45R is formed via a planarization film 44. Through the formation of the red color filter 45R, the red light emitting portion 11R illustrated in FIG. 1B is formed (OLED (the light emitting portion of the OLED) is used as the red light emitting portion 11R). Through formation of a green color filter, the green light emitting portion 11G is formed and, through formation of a blue color filter, the blue light emitting portion 11B is formed, though not illustrated in FIG. 1A. Additionally, over an entire region where the plurality of light emitting portions are arranged, a protective film 46 is formed. The planarization film 44 is a transparent film made of a silicon oxide, a resin, or the like, while the protective film 46 is also a transparent film made of a resin or the like.

In the first substrate 20, a through electrode 26 is formed to extend through the first semiconductor substrate 21 and the insulating film 32. By the through electrode 26, the MOS transistor of the first semiconductor substrate 21 (MOS transistor provided in the first semiconductor substrate 21) and the lower electrode 41 are electrically connected. Examples of a material to be used for the through electrode 26 include a metal such as Cu.

To implement the see-through function, a plurality of light guiding portions 29 are formed in the first semiconductor substrate 21 to transmit light, while a plurality of light guiding portions 59 are formed in the second semiconductor substrate 51 to transmit light. The plurality of light guiding portions 29 and the plurality of light guiding portions 59 are arranged in a region (in a pixel arrangement portion 7 described later) where the plurality of light emitting portions are arranged. Specifically, in portions serving as the light transmitting portions 11T, holes extending through the first semiconductor substrate 21 and holes extending through the second semiconductor substrate 51 are formed. The portions in which the holes extending through the first semiconductor substrate 21 are formed serve as the light guiding portions 29, while the portions in which the holes extending through the second semiconductor substrate 31 are formed serve as the light guiding portions 59. Preferably, the holes formed in the light guiding portions 29 and 59 are filled with transparent members made of a silicon oxide or the like. As a result of the formation of the light guiding portions 29 and 59, the light transmitting portions 11T are formed, and external light 12 is transmitted by the display device 1. On an upper side of each of the light guiding portions 29, an insulating film 33 made of a silicon oxide or the like is formed. Note that, in FIG. 1A, a structure in which the upper electrode 43 is not present in each of the light transmitting portions 11T is illustrated but, since the upper electrode 43 is transparent, the upper electrode 43 may also be present in each of the light transmitting portions 11T.

In a line B-B' portion in FIG. 1B, there are the green light emitting portion 11G and the blue light emitting portion 11B. The green light emitting portion 11G and the blue light emitting portion 11B have the same cross sections as a cross section of the red light emitting portion 11R illustrated in FIG. 1A.

Figure 2:
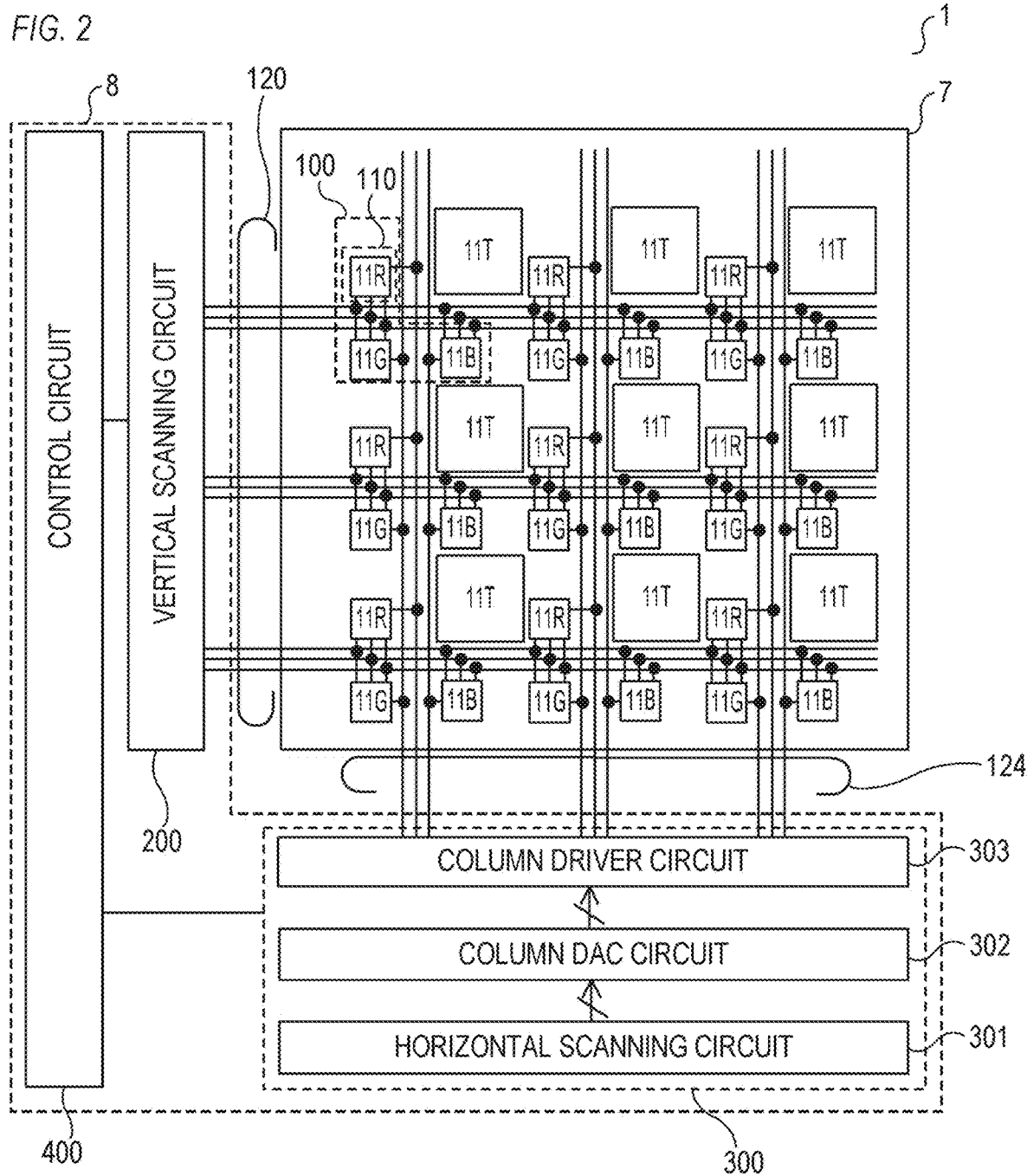
FIG. 2 is an example of a circuit diagram of the display device according to the first embodiment.

FIG. 2 is a circuit diagram of the display device 1. The display device 1 includes the pixel arrangement portion 7 corresponding to a display region and a peripheral circuit portion 8 that drives the pixel arrangement portion 7. The peripheral circuit portion 8 includes a vertical scanning circuit 200, a signal output circuit 300, and a control circuit 400.

The signal output circuit 300 is a circuit that outputs, to each of the pixels 100, an image signal (representing information on a brightness and a chromaticity of the pixel 100). The vertical scanning circuit 200 is a circuit that outputs a signal for controlling a drive circuit for each of the pixels 100. The control circuit 400 is a circuit that controls drive timing for each of the pixels 100, the brightness thereof, the chromaticity thereof, and the like, and is connected via wiring to the signal output circuit 300 and to the vertical scanning circuit 200.

The vertical scanning circuit 200 is connected to the plurality of pixels 100 via a plurality of groups of scanning lines 120. The signal output circuit 300 includes a horizontal scanning circuit 301, a column DAC circuit 302 including a plurality of digital-analog conversion circuits (DAC circuits) and a column driver circuit 303 including a plurality of driver circuits. The column driver circuit 303 includes the plurality of driver circuits individually corresponding to a plurality of vertical signal lines 124 connected to the plurality of pixels 100 (the plurality of sub-pixels 110). The column DAC circuit 302 includes the plurality of DAC circuits individually corresponding to the plurality of vertical signal lines 124, i.e., the plurality of DAC circuits individually corresponding to the plurality of driver circuits.

The horizontal scanning circuit 301 scans the plurality of DAC circuits included in the column DAC circuit 302, and outputs a digital signal input thereto from the control circuit 400 to each of the DAC circuits. Each of the DAC circuits converts the digital signal input thereto to an analog signal, and outputs the analog signal to the corresponding driver circuit.

Each of the plurality of driver circuits included in the column driver circuit 303 outputs the analog signal input thereto from the corresponding DAC circuit to the corresponding vertical signal line 124. The analog signal output from the driver circuit to the vertical signal line 124 is input (supplied) to the plurality of pixels 100 (the plurality of sub-pixels 110) connected to the vertical signal line 124.

In the pixel arrangement portion 7, the plurality of pixels 100 and the plurality of light transmitting portions 11T are arranged. Both of the plurality of pixels 100 and the plurality of light transmitting portions 11T are arranged in a matrix arrangement. Each of the pixels 100 includes the red light emitting portion 11R, the green light emitting portion 11G, and the blue light emitting portion 11B each serving as the sub-pixel 110.

Figure 3:
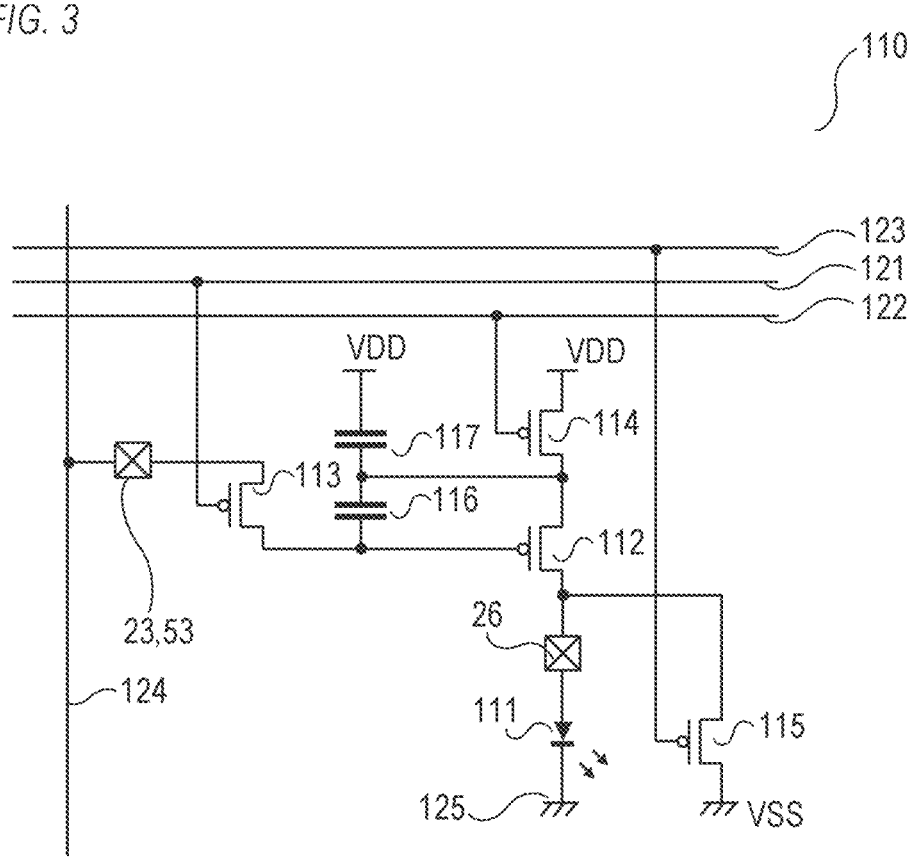
FIG. 3 is an example of a circuit diagram of a sub-pixel according to the first embodiment.

FIG. 3 is a circuit diagram of each of the sub-pixels 110. The sub-pixel 110 includes an OLED 111 having a light emission luminance which varies depending on a current supplied thereto, a drive transistor 112, a selection transistor 113, switching transistors 114 and 115, and capacitive elements 116 and 117. It is assumed in the first embodiment that, as each of the drive transistor 112, the selection transistor 113, and the switching transistors 114 and 115, a p-channel transistor (PMOS transistor) is used. Note that, as at least any of these transistors, an n-channel transistor (NMOS transistor) may also be used.

The drive transistor 112 has a drain connected in series to an anode of the OLED 111 via the through electrode 26. The drive transistor 112 supplies a current to the OLED 111. The OLED 111 has a cathode connected to a common voltage 125 for the entire pixel arrangement portion 7.

Each of the groups of scanning lines 120 include scanning lines 121 to 123, and the selection transistor 113 has a gate connected to the scanning line 121. The selection transistor 113 has a source connected to the vertical signal line 124 via the bonding metal wirings 23 and 53, and has a drain connected to a gate of the drive transistor 112. To a gate of the selection transistor 113, a selection signal is supplied from the vertical scanning circuit 200 via the scanning line 121.

The switching transistor 114 has a gate connected to the scanning line 122, has a source connected to a power source voltage VDD, and has a drain connected to a source of the drive transistor 112. To the gate of the switching transistor 114, a signal for switchably turning ON/OFF light emission from the OLED 111 is supplied from the vertical scanning circuit 200 via the scanning line 122.

The switching transistor 115 has a gate connected to the scanning line 123, has a source connected to a ground voltage VSS, and has a drain connected to the anode of the OLED 111. To the gate of the switching transistor 115, a signal for controlling a voltage at the anode of the OLED 111 is applied from the vertical scanning circuit 200 via the scanning line 123 during a calibration period.

The capacitive element 116 is connected between the gate of the drive transistor 112 and the source of the drive transistor 112. The capacitive element 117 is connected between the source of the drive transistor 112 and the power source voltage VDD.

In the sub-pixel 110, the selection transistor 113 comes into a conductive state in response to a selection signal (write signal) supplied from the vertical scanning circuit 200 to the gate via the scanning line 121. By this operation, the image signal (representing the information on the brightness of the sub-pixel 110) is sampled from the vertical signal line 124 to the gate electrode of the drive transistor 112. During the calibration period, a reference voltage is sampled from the vertical signal line 124, and variations in a threshold voltage of the drive transistor 112 of each of the sub-pixels 110 are corrected. This can reduce variations in the brightness and chromaticity of each of the pixels 100 resulting from threshold voltage variations.

In the first embodiment, the drive transistor 112, the selection transistor 113, and the switching transistors 114 and 115 each illustrated in FIG. 3 are formed in the single-crystal semiconductor substrate. Any of the drive transistor 112, the selection transistor 113, and the switching transistors 114 and 115 corresponds to the MOS transistor including the gate electrode 25 described with reference to FIG. 1A. Each of the remaining others of the drive transistor 112, the selection transistor 113, and the switching transistors 114 and 115 corresponds to the MOS transistor including the gate electrode 55. In other words, any of the drive circuits (the MOS transistor described above and the peripheral circuit thereof) that drive the sub-pixels 110 (light emitting portions) is formed in the first semiconductor substrate 21, while each of the remaining other drive circuits that drive the sub-pixels 110 is formed in the second semiconductor substrate 51.

Thus, it is possible to further miniaturize the drive circuits (miniaturize the pixels) than in the case where the TFT is used, and consequently allow the display device 1 to perform higher-definition display. For example, it is possible to set a pixel pitch to 30 μm or less. It is also possible to set the pixel pitch to 10 μm or less or 5 μm or less. In addition, since a carrier mobility in the MOS transistor is high, it is also possible to speed up processing in the display device 1 (drive circuit) and a response therefrom. For example, it is possible to increase a frame rate of the display by the display device 1. In addition, since a leakage current while the MOS transistor is OFF is small in amount, it is also possible to reduce power consumption of the display device 1. Moreover, it is also possible to increase functionality of the display device 1 by using the capacitive elements 116 and 117 to allow the brightness variations, the chromaticity variations, and the like to be corrected on a per pixel basis. By correcting the brightness variations and the chromaticity variations on a per pixel basis, it is possible to implement display with small in-plane variations.

Moreover, by forming the circuit in the second semiconductor substrate 51, it is possible to further increase the functionality of the display device 1. For example, it is possible to allow the circuit in the second semiconductor substrate 51 to have at least any of functions of the peripheral circuit portion 8. Thus, it is possible to reduce a size of a circuit on the periphery of the pixel arrangement portion 7 and reduce a size of the display device 1. In addition, it is possible to divide the pixel arrangement portion 7 into a plurality of regions, and perform control such as varying of a frame rate from one region to another.

Referring to FIGS. 1A, 4A, 4B, 5A, 5B, 6A and 6B, a method of manufacturing the display device 1 will be described. FIGS. 4A, 4B, 5A, 5B, 6A and 6B are cross-sectional views for illustrating an example of the method of manufacturing the display device 1.

Figure 4A:
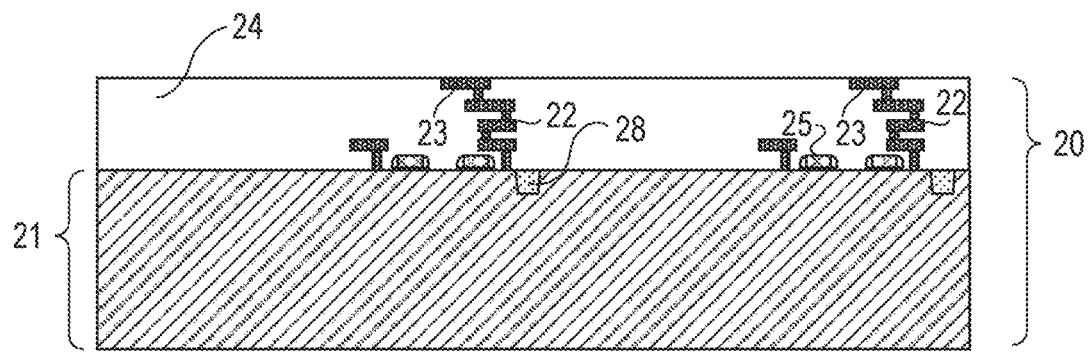
FIGS. 4A and 4B are cross-sectional views for illustrating an example of a method of manufacturing the display device according to the first embodiment.
Figure 4A:
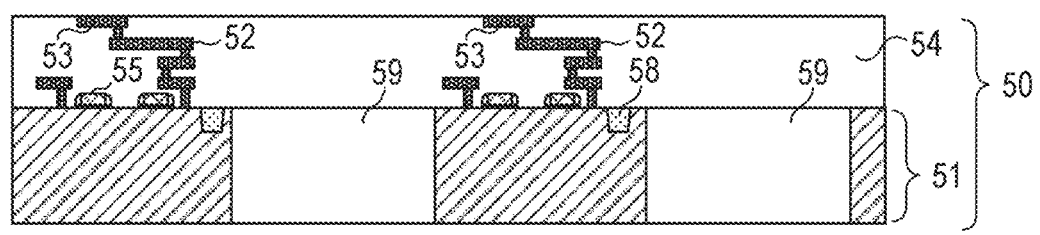

First, as illustrated in FIG. 4A, the first substrate 20 including the first semiconductor substrate 21 and the second substrate 50 including the second semiconductor substrate 51 are prepared.

The first substrate 20 is a substrate in which the light emitting portions are to be formed in subsequent steps. In the first substrate 20, using a typical semiconductor manufacturing process, the metal wirings 22, the bonding metal wirings 23, the interlayer insulating film 24, the MOS transistors including the gate electrodes 25, and the STIs 28 are arranged.

In the second substrate 50 also, using the typical semiconductor manufacturing process, the metal wirings 52, the bonding metal wirings 53, the interlayer insulating film 54, the MOS transistors including the gate electrodes 55, and the STIs 58 are arranged. In addition, in the portions of the second semiconductor substrate 51 serving as the light guiding portions 59, the holes are formed to extend through the second semiconductor substrate 51. Since the second semiconductor substrate 51 also has the function of maintaining a physical strength of the display device 1, the second semiconductor substrate 51 is thick, and a thickness of the second semiconductor substrate 51 is, e.g., not less than 300 μm and not more than 700 μm. Accordingly, the holes of the light guiding portions 59 are preferably formed by wet etching. In addition, the holes of the light guiding portions 59 are preferably formed before the MOS transistors, the gate electrodes 55 of the MOS transistors, and the STIs 58 are formed. As described above, the holes of the light guiding portions 59 are preferably filled with the transparent members but, in the first embodiment in which a ratio (aspect ratio) of the thickness of each of the light guiding portions 59 to a width thereof is large, i.e., the holes in the light guiding portions 59 are oblong, it is difficult to fill the holes of the light guiding portions 59 with the transparent members. Therefore, it is assumed in the first embodiment that the holes in the light guiding portions 59 are not filled with the transparent members.

Figure 4B:
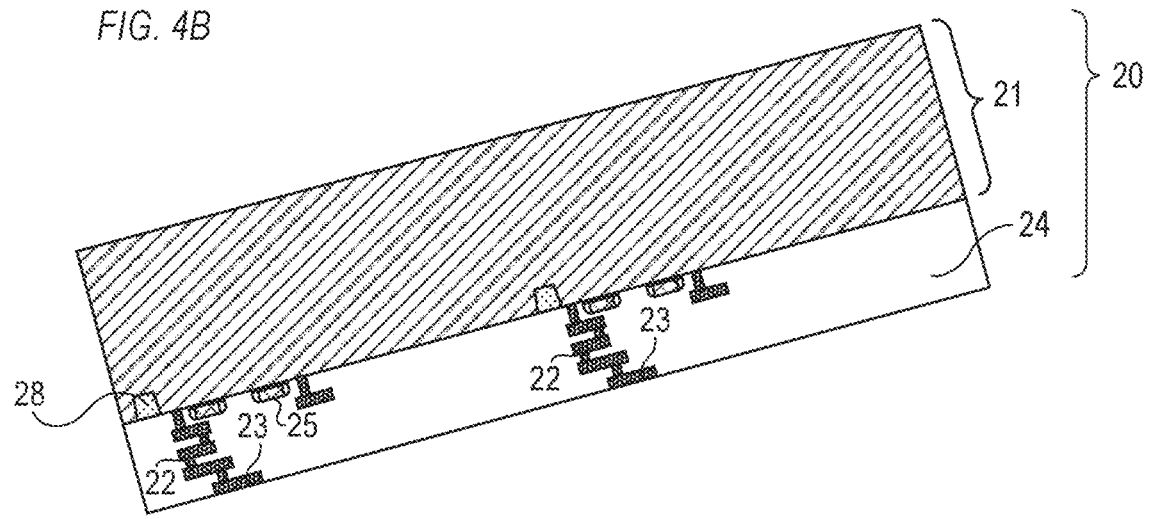
Figure 4B:
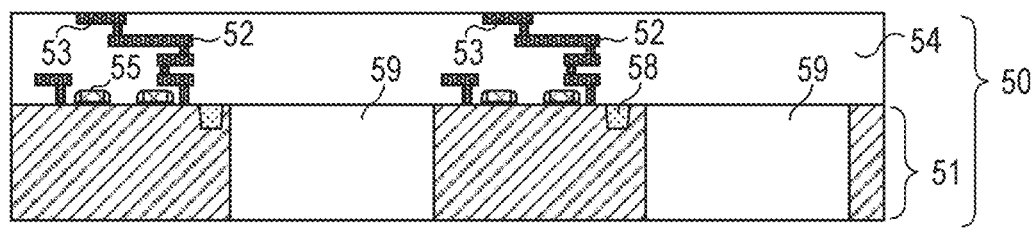
Figure 5A:
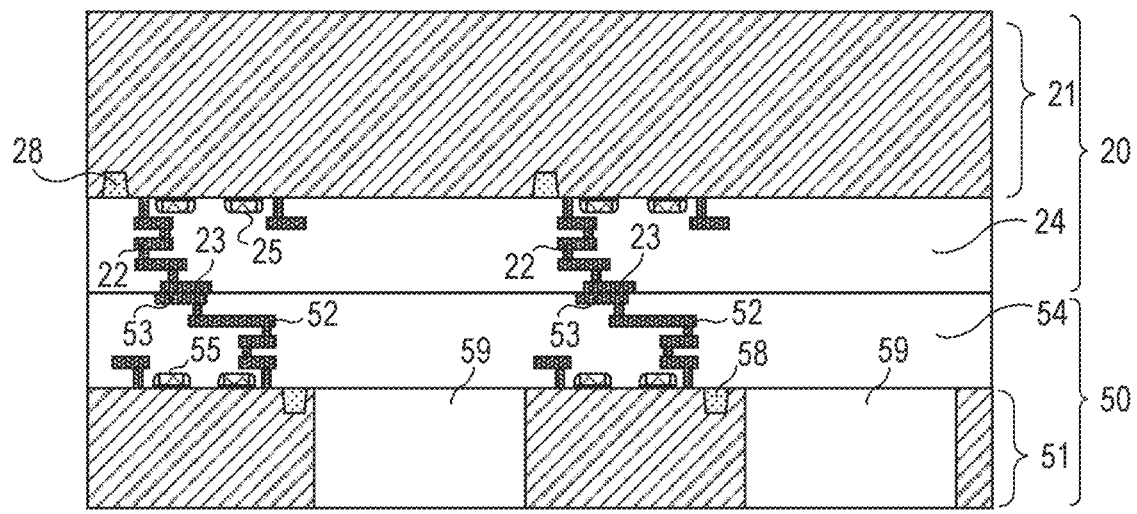
FIGS. 5A and 5B are cross-sectional views for illustrating the example of the method of manufacturing the display device according to the first embodiment.

Next, as illustrated in FIG. 4B, a direction of the first substrate 20 is changed to cause the bonding metal wirings 23 of the first substrate 20 to face the bonding metal wirings 53 of the second substrate 50. Then, as illustrated in FIG. 5A, using a wafer bonding technique, the first substrate 20 and the second substrate 50 are bonded together. Consequently, the bonding metal wirings 23 and the bonding metal wirings 53 are electrically connected. When the first substrate 20 and the second substrate 50 are to be bonded together, surface treatment is performed on surfaces thereof to be bonded together, and alignment for reducing misalignment between bonding positions (e.g., misalignment between the bonding metal wirings 23 and the bonding metal wirings 53) is performed. Note that the surface of the first substrate 20 to be bonded to the second substrate 50 is a surface (back surface) opposite to a surface (front surface) provided with the plurality of light emitting portions.

Figure 5B:
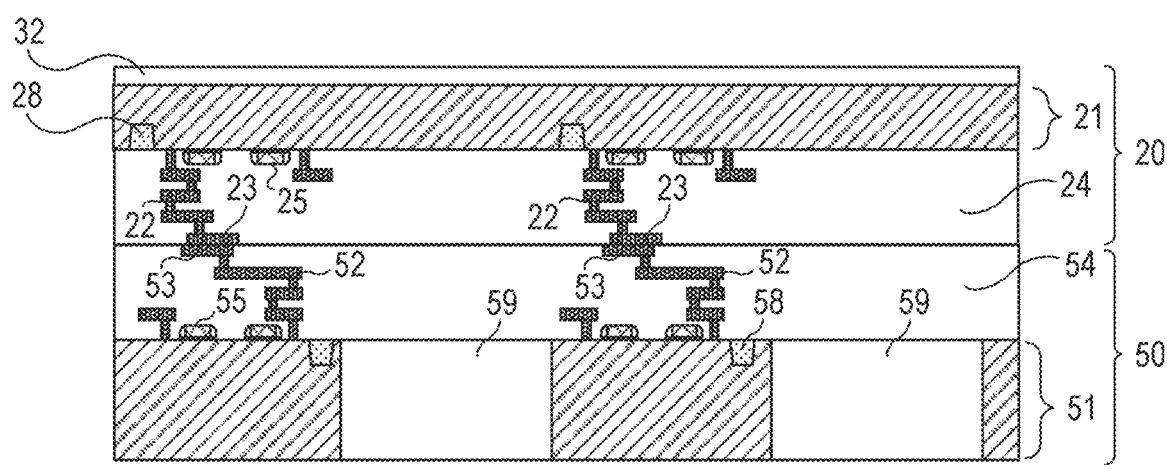

Next, as illustrated in FIG. 5B, the first semiconductor substrate 21 is thinned. As a result, the thickness of the first semiconductor substrate 21 becomes, e.g., not less than 2 μm and not more than 10 μm. The thickness of the first semiconductor substrate 21 may also be larger than 10 μm, and may also be, e.g., not less than 2 μm and not more than 30 μm. A method of thinning the first semiconductor substrate 21 may be any of mechanical polishing, chemical mechanical polishing (CMP), dry etching, wet etching, and the like. After the thinning, the insulating film 32 is formed on the surface (surface to be formed with the light emitting portions) of the first semiconductor substrate 21 by a plasma CVD method or the like.

Figure 6A:
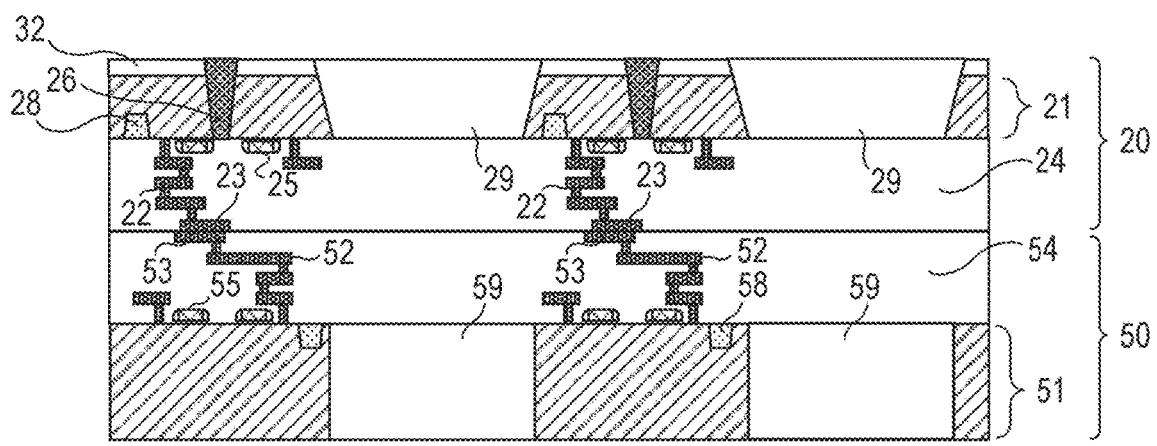
FIGS. 6A and 6B are cross-sectional views for illustrating the example of the method of manufacturing the display device according to the first embodiment.

Next, as illustrated in FIG. 6A, the plurality of holes are formed in the first semiconductor substrate 21 and the insulating film 32 to extend therethrough. In some of the plurality of holes, the through electrodes 26 are formed. The remaining others of the plurality of holes serve as the light guiding portions 29. The holes of the light guiding portions 29 are filled with the transparent members. Preferably, the plurality of holes are formed by, e.g., patterning a resist so as to form holes at intended positions, and then performing etching using a dry etching method. For the step of forming the holes and forming the through electrodes 26 and the transparent members in the holes, a TSV (Through Silicon Via) forming technique is preferably used.

Figure 6B:
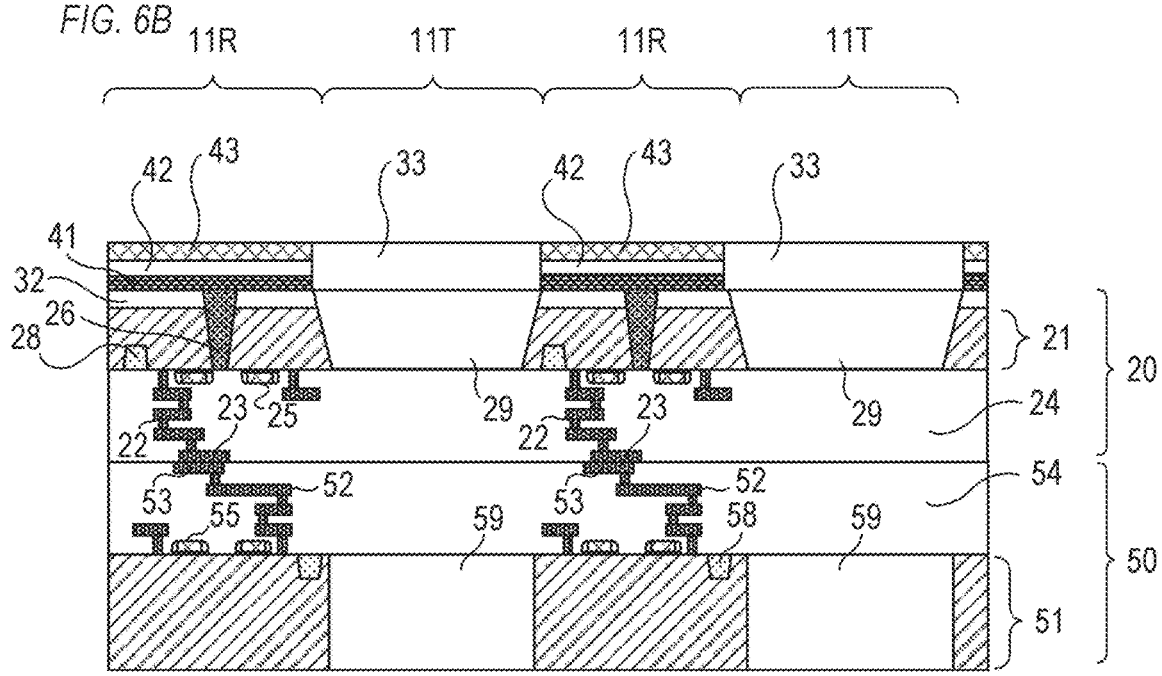

Next, as illustrated in FIG. 6B, in each of the portions serving as the red light emitting portion 11R, the lower electrode 41, the organic EL film 42, and the upper electrode 43 are formed. In each of the portions serving as the light transmitting portion 11T, the insulating film 33 is formed.

Next, as illustrated in FIG. 1A, the planarization film 44 is formed and, in each of the portions serving as the red light emitting portion 11R, the color filter 45R is formed. Then, over the entire pixel arrangement portion 7, the protective film 46 is formed to thus complete the display device 1.

Figure 7A:
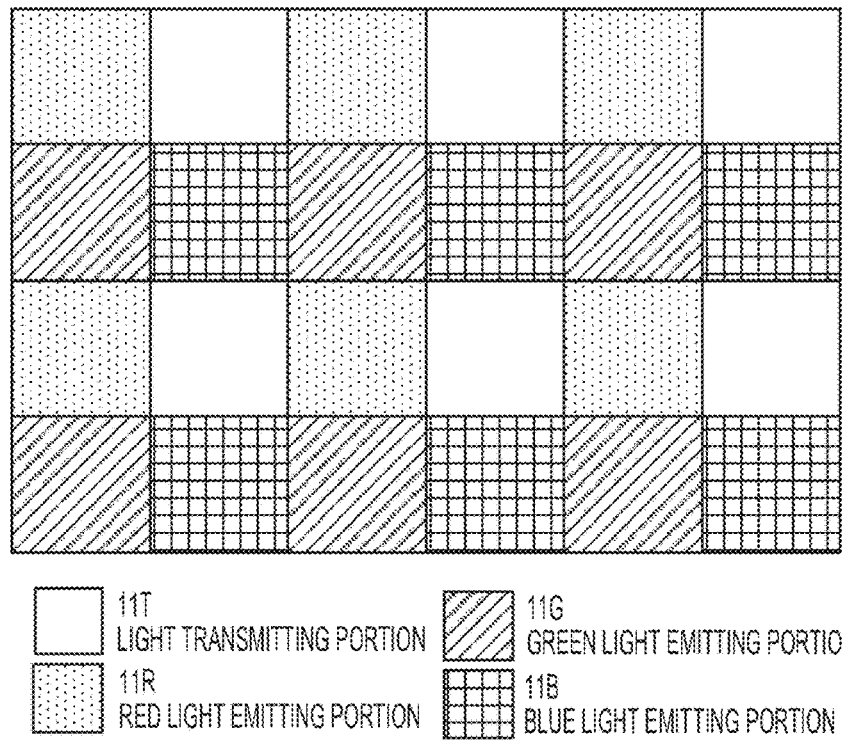
FIGS. 7A and 7B are plan views illustrating an example of pixel arrangement according to the first embodiment.
Figure 7B:
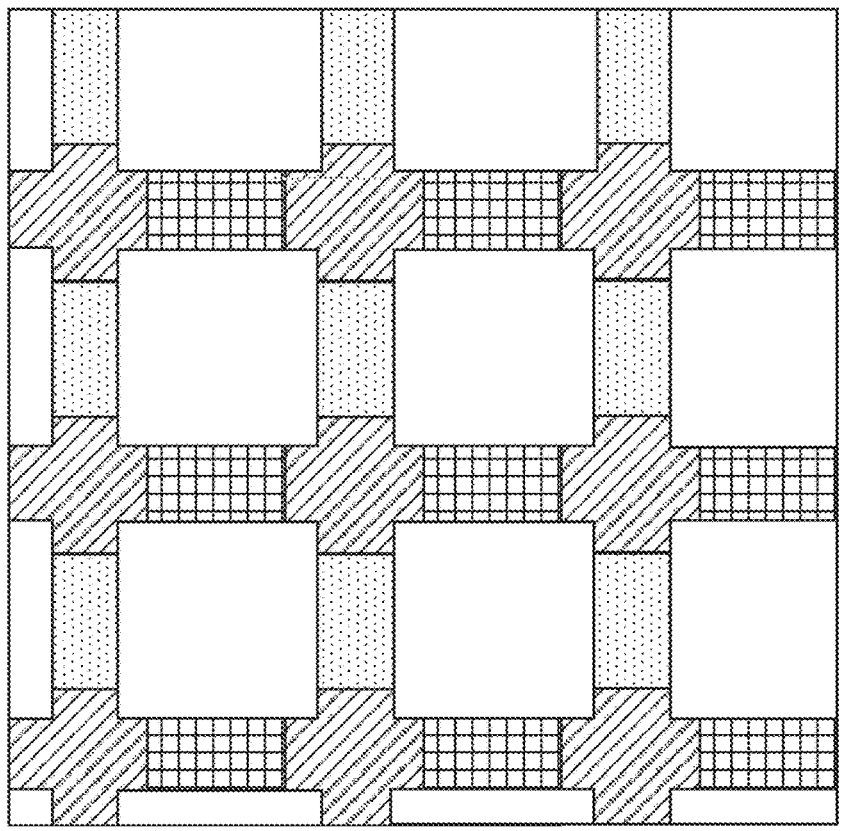
Figure 8A:
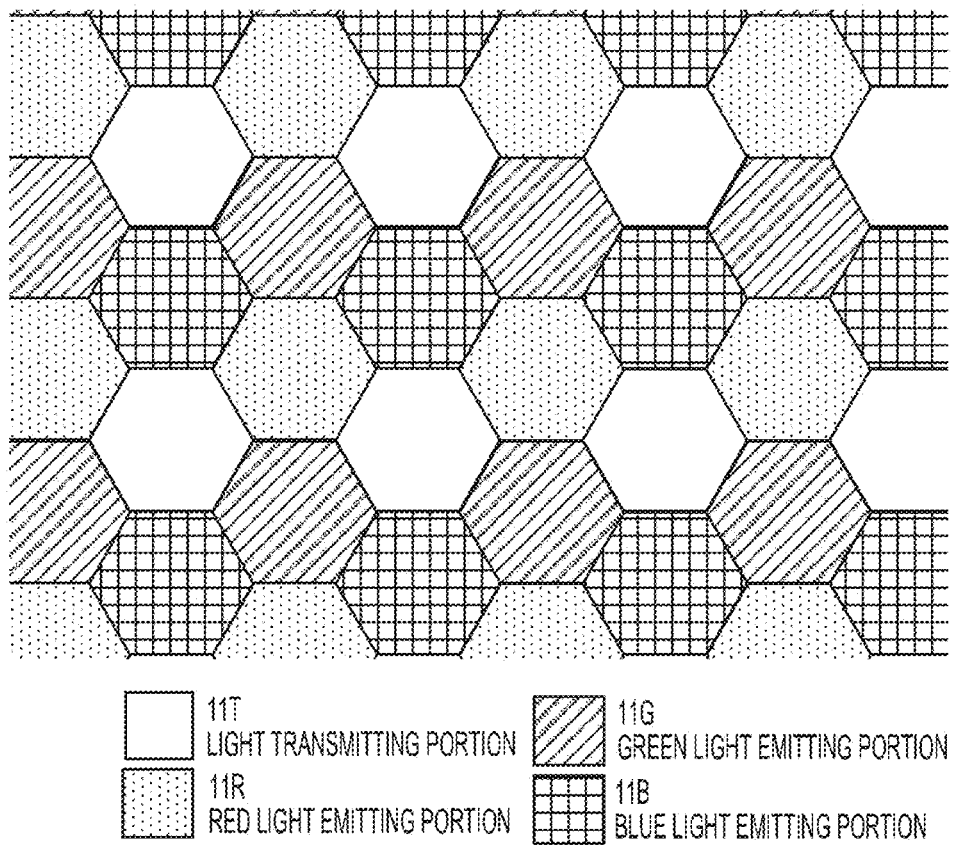
FIGS. 8A and 8B are plan views illustrating another example of the pixel arrangement according to the first embodiment.
Figure 8B:
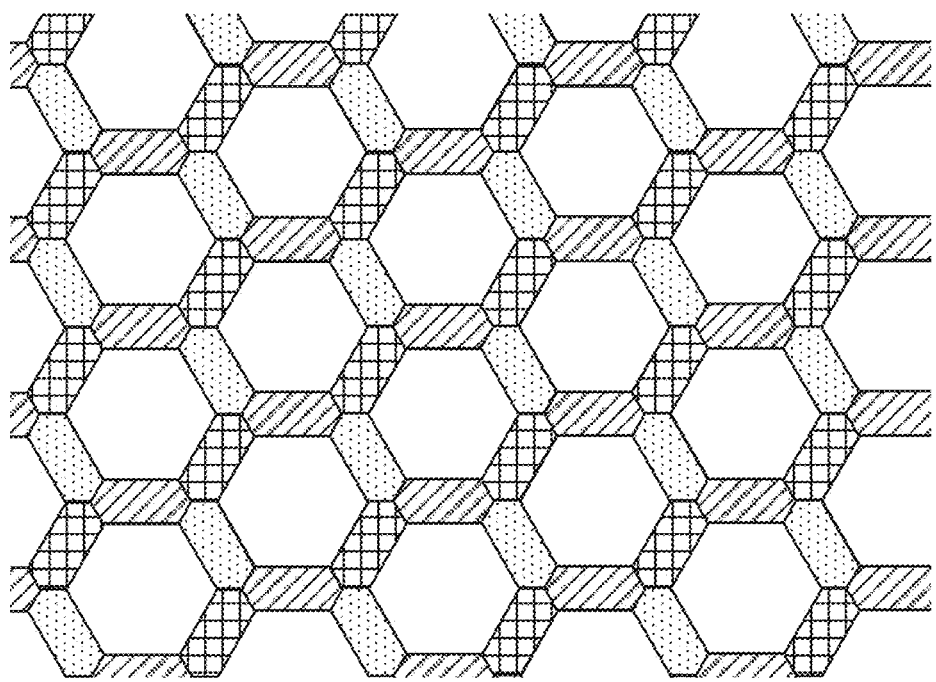

FIGS. 7A, 7B, 8A, and 8B are plan views (plan views obtained by viewing a pixel arrangement in a direction perpendicular to the front surface (the surface provided with the plurality of light emitting portions) of the first substrate 20) each illustrating an example of the pixel arrangement according to the first embodiment. As illustrated in FIG. 7A, it may be possible to arrange the light transmitting portions 11T, the green light emitting portions 11G, the red light emitting portions 11R, and the blue light emitting portions 11B in a square arrangement. Alternatively, as illustrated in FIG. 7B, it may also be possible to arrange the light transmitting portions 11T, the green light emitting portions 11G, the red light emitting portions 11R, and the blue light emitting portions 11B in a square arrangement and form each of the light transmitting portions 11T (the light guiding portions 29 and 59) in a size larger than that of each of the green light emitting portions 11G, the red light emitting portions 11R, and the blue light emitting portions 11B. Still alternatively, as illustrated in FIG. 8A, it may also be possible to arrange the light transmitting portions 11T, the green light emitting portions 11G, the red light emitting portions 11R, and the blue light emitting portions 11B in a delta arrangement. Yet alternatively, as illustrated in FIG. 8B, it may also be possible to arrange the light transmitting portions 11T, the green light emitting portions 11G, the red light emitting portions 11R, and the blue light emitting portions 11B in a delta arrangement and form each of the light transmitting portions 11T (the light guiding portions 29 and 59) in a size larger than that of each of the green light emitting portions 11G, the red light emitting portions 11R, and the blue light emitting portions 11B. In any of the arrangements, a pitch between the pixels and a pitch between the light transmitting portions 11T (the light guiding portions 29 and 59) are preferably not more than 30 μm (not less than 2 μm and not more than 30 μm). Additionally, a width of each one of the light transmitting portions 11T (the light guiding portions 29 and 59) is preferably not less than 2 μm and not more than 28 μm.

Each of the pixel can be considered herein to include, as the sub-pixels, the light transmitting portion 11T, the green light emitting portion 11G, the red light emitting portion 11R, and the blue light emitting portion 11B. These sub-pixels can be considered to be arranged in the square arrangement or the delta arrangement. A size of each of the light transmitting portions in plan view may be the same as a size of each of the light emitting portions, i.e., a size of each of the sub-pixels in plan view. Alternatively, as described above, the size of the light transmitting portion in plan view may be larger than the size of the light emitting portion in plan view. Locations of the arranged light transmitting portions 11T are not limited thereto and, when the sub-pixels are arranged in a matrix arrangement, the light transmitting portions 11T may also be provided in every other row or column in a row direction or a column direction.

As described above, in the first embodiment, by forming the plurality of light guiding portions 29 in the single-crystal semiconductor substrate (the first semiconductor substrate 21) which is opaque and therefore considered to be unsuitable for a see-through display device, it is possible to implement the see-through display device 1. In addition, by forming the drive circuit for the light emitting portions in the single-crystal semiconductor substrate, it is possible to miniaturize the pixels in the display device 1, and consequently increase the definition, speed, and functionality of the display device 1 and reduce the power consumption thereof.

While the example in which the color filter is used for each of the light emitting portions has been described, it may also be possible to use different organic light emitting materials (e.g., the organic light emitting materials forming the organic EL films 42) for the plurality of light emitting portions and thereby allow the plurality of light emitting portions to emit light beams in different colors. In this case, the color filters need not necessarily be used. Additionally, while the example in which each of the light emitting portions is the OLED has been described, it may also be possible to use another self-luminous element such as a light emitting diode (LED) as each of the light emitting portions. In this case, for example, minute LEDs are arranged on the first semiconductor substrate 21 or the LEDs for different colors are formed by patterning.

Second Embodiment

Figure 9:
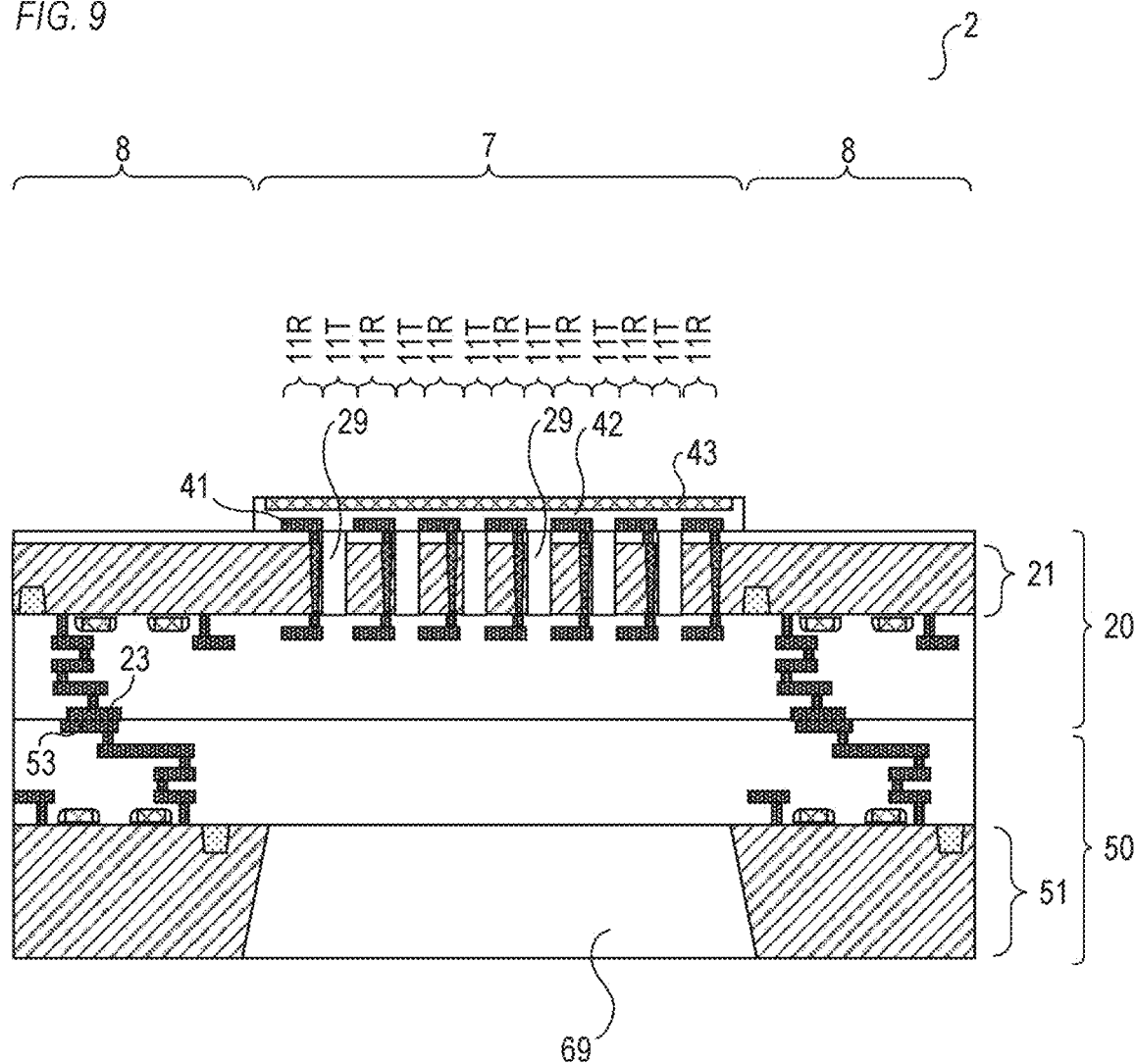
FIG. 9 is an example of a cross-sectional view of a display device according to a second embodiment.

A description will be given below of a second embodiment of the present invention. FIG. 9 is a cross-sectional view of a display device 2 according to the second embodiment. In the second embodiment, in the second semiconductor substrate 51, instead of the plurality of light guiding portions 59 described in the first embodiment, one light guiding portion 69 is formed to correspond to the entire pixel arrangement portion 7. In the second embodiment, the bonding metal wirings 23 and 53 formed in the pixel arrangement portion 7 in the first embodiment are formed in the peripheral circuit portion 8. In FIG. 9, the color filters and the like are not illustrated, but are present in the same manner as in the first embodiment. Note that, as described in the first embodiment, the color filters need not necessarily be used, and the display device 2 may be a monochrome display device. In the case of the monochrome display device, the color filters are not required.

A method of manufacturing the display device 2 is substantially the same as the method of manufacturing the display device 1 described in the first embodiment. The light guiding portion 69 is formed by the same formation method as used to form the light guiding portions 59 described with reference to FIG. 4A in the first embodiment.

As described in the first embodiment, the second semiconductor substrate 51 functions also to maintain a physical strength of the display device 2. Accordingly, the second semiconductor substrate 51 is thick, and a thickness of the second semiconductor substrate 51 is, e.g., not less than 300 μm and not more than 700 μm. In the second semiconductor substrate 51 having such a large thickness, the large light guiding portion 69 corresponding to the entire pixel arrangement portion 7 can more easily be formed than the light guiding portions 59 in the first embodiment. Therefore, the display device 2 can more easily be manufactured than the display device 1 in the first embodiment.

Third Embodiment

Figure 10:
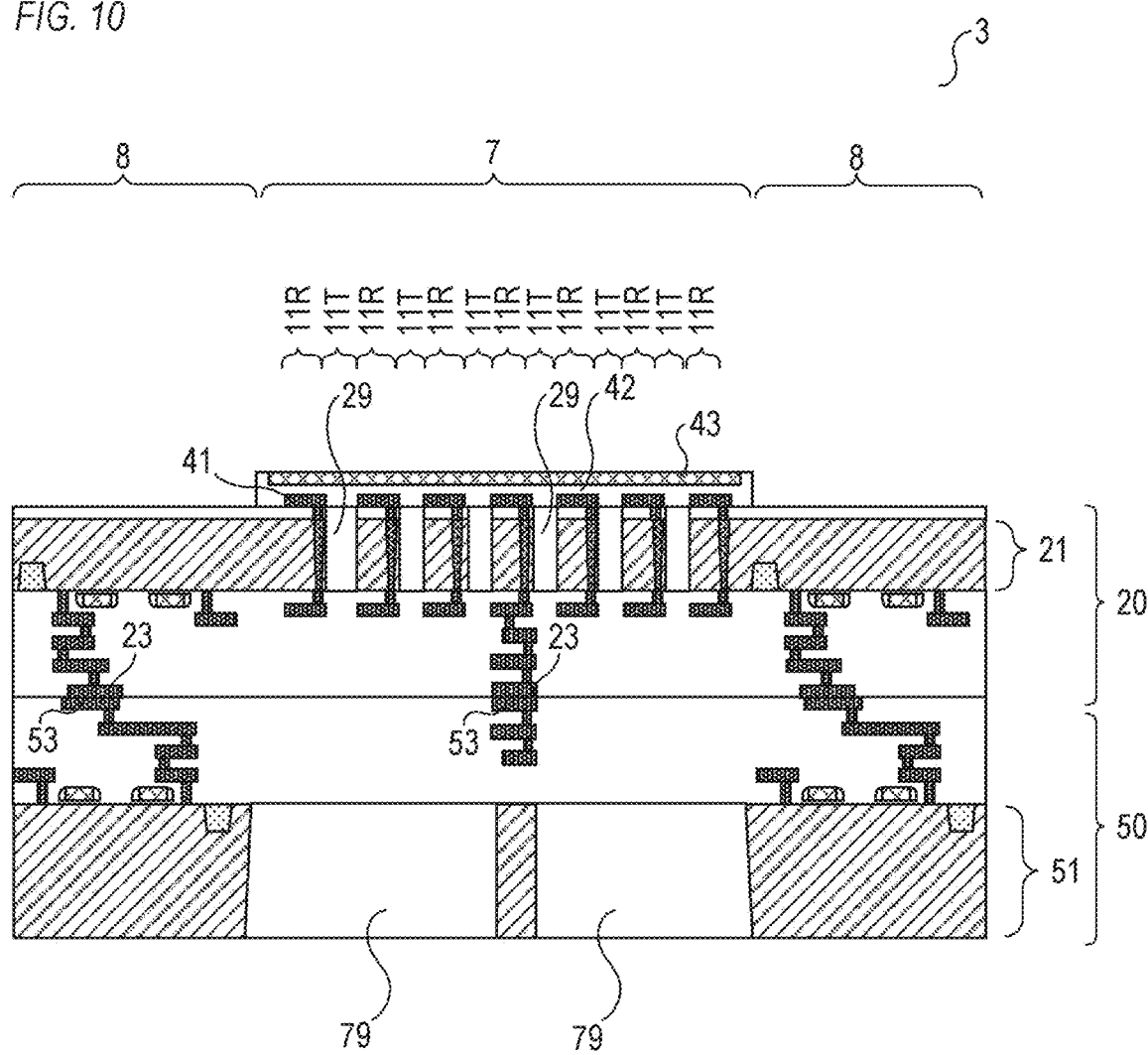
FIG. 10 is an example of a cross-sectional view of a display device according to a third embodiment.

A description will be given below of a third embodiment of the present invention. FIG. 10 is a cross-sectional view of a display device 3 according to the third embodiment. In the third embodiment, in the second semiconductor substrate 51, a plurality of light guiding portions 79 are formed instead of the plurality of light guiding portions 59 described in the first embodiment such that each of the light guiding portions 79 corresponds to the plurality of pixels 100 and to the plurality of light transmitting portions 11T. In the third embodiment, the bonding metal wirings 23 and 53 are formed in the peripheral circuit portion 8 and in a part of the pixel arrangement portion 7 in which the second semiconductor substrate 51 is left. Alternatively, the bonding metal wirings 23 and 53 may also be formed in one of the peripheral circuit portion 8 and the part of the pixel arrangement portion 7 in which the second semiconductor substrate 51 is left. In FIG.

10, the color filters and the like are not illustrated, but are present in the same manner as in the first embodiment. Note that, as described in the first embodiment, the color filters need not necessarily be used, and the display device 3 may be a monochrome display device.

A manufacturing method in the third embodiment is substantially the same as the method of manufacturing the display device 1 described in the first embodiment. The light guiding portions 79 are formed by the same formation method as used to form the light guiding portions 59 described with reference to FIG. 4A in the first embodiment.

As described in the first embodiment, the second semiconductor substrate 51 functions also to maintain a physical strength of the display device 3. Accordingly, the second semiconductor substrate 51 is thick, and a thickness of the second semiconductor substrate 51 is, e.g., not less than 300 μm and not more than 700 μm. In the second semiconductor substrate 51 having such a large thickness, the large light guiding portions 79 can more easily be formed than the light guiding portions 59 in the first embodiment. Therefore, the display device 3 can more easily be manufactured than the display device 1 in the first embodiment.

Fourth Embodiment

Figure 11:
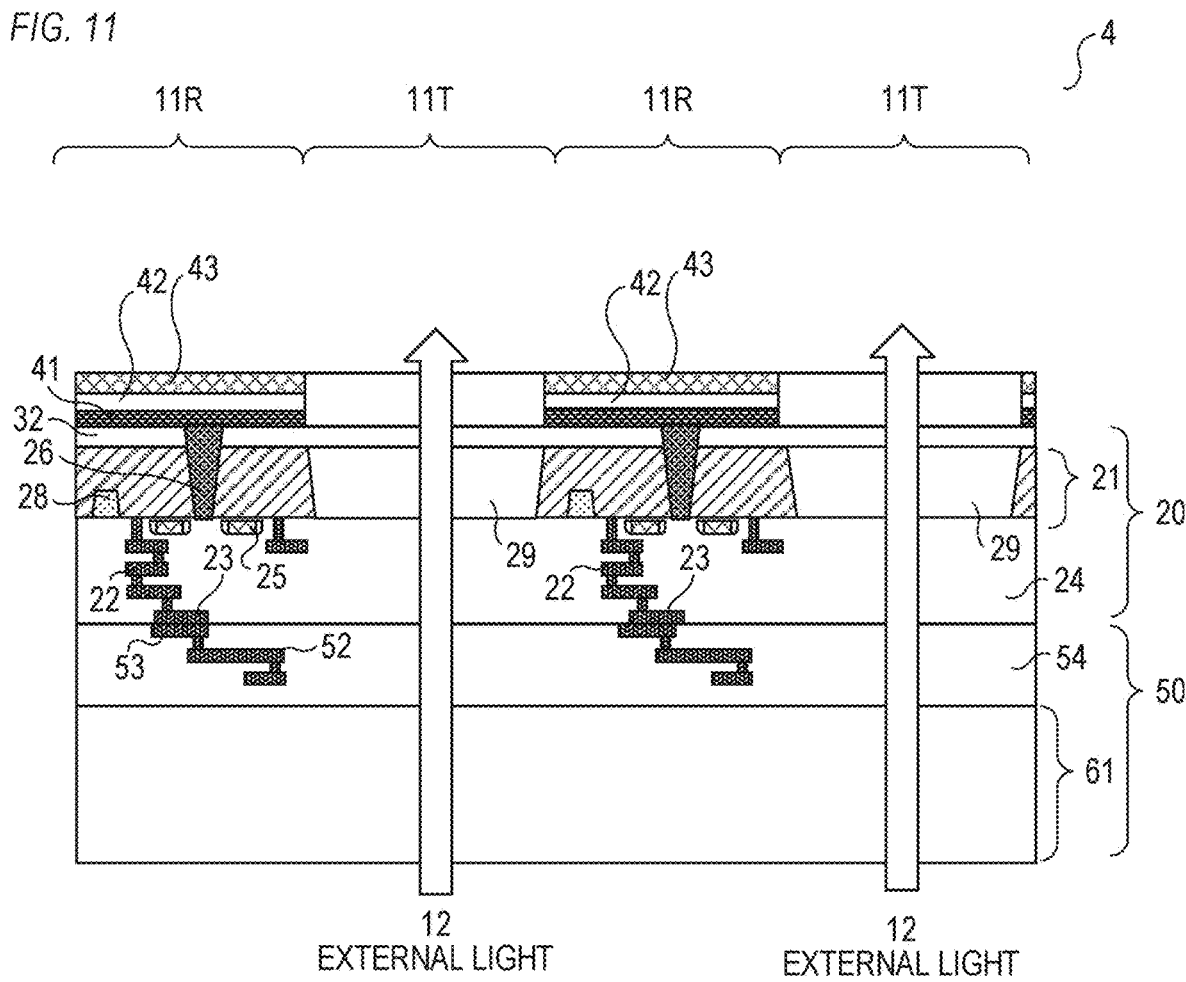
FIG. 11 is an example of a cross-sectional view of a display device according to a fourth embodiment.

A description will be given below of a fourth embodiment of the present invention. FIG. 11 is a cross-sectional view of a display device 4 according to the fourth embodiment. The fourth embodiment uses a transparent substrate 61 instead of the second semiconductor substrate 51 described in the first embodiment. Since the interlayer insulating film 54 is transparent, it can be said that the second substrate 50 is also a transparent substrate. As the transparent substrate 61, a substrate having a thermal expansion coefficient similar to that of a single-crystal silicon substrate, such as a sapphire substrate, is preferably used, but a typical glass substrate may also be used instead. To maintain the physical strength of the display device 4, the transparent substrate 61 is preferably thick. For example, a thickness of the transparent substrate 61 is preferably not less than 300 μm and not more than 2000 μm. In FIG. 11, the color filters and the like are not illustrated, but are present in the same manner as in the first embodiment. Note that, as described in the first embodiment, the color filters need not necessarily be used, and the display device 4 may be a monochrome display device.

A method of manufacturing the display device 4 is substantially the same as the method of manufacturing the display device 1 described in the first embodiment. Over the transparent substrate 61, the metal wirings 52, the bonding metal wirings 53, and the interlayer insulating film 54 are formed to provide the second substrate 50. However, in the fourth embodiment, the MOS transistors including the gate electrodes 55 and the STIs 58 are not provided in the second substrate 50. In the fourth embodiment, all of the drive transistor 112, the selection transistor 113, the switching transistor 114, and the switching transistor 115 in FIG. 3 correspond to each of the MOS transistors including the gate electrodes 25. In other words, all the drive circuits (the MOS transistors described above and the circuits on the peripheries thereof) that drive the sub-pixels 110 (the light emitting portions) are formed in the first semiconductor substrate 21.

While the light guiding portions 59 are formed in the second semiconductor substrate 51 in the first embodiment, the fourth embodiment uses the transparent substrate 61 instead of the second semiconductor substrate 51 to allow the see-through display device to be implemented without forming the light guiding portions 59.

Fifth Embodiment

Figure 12:
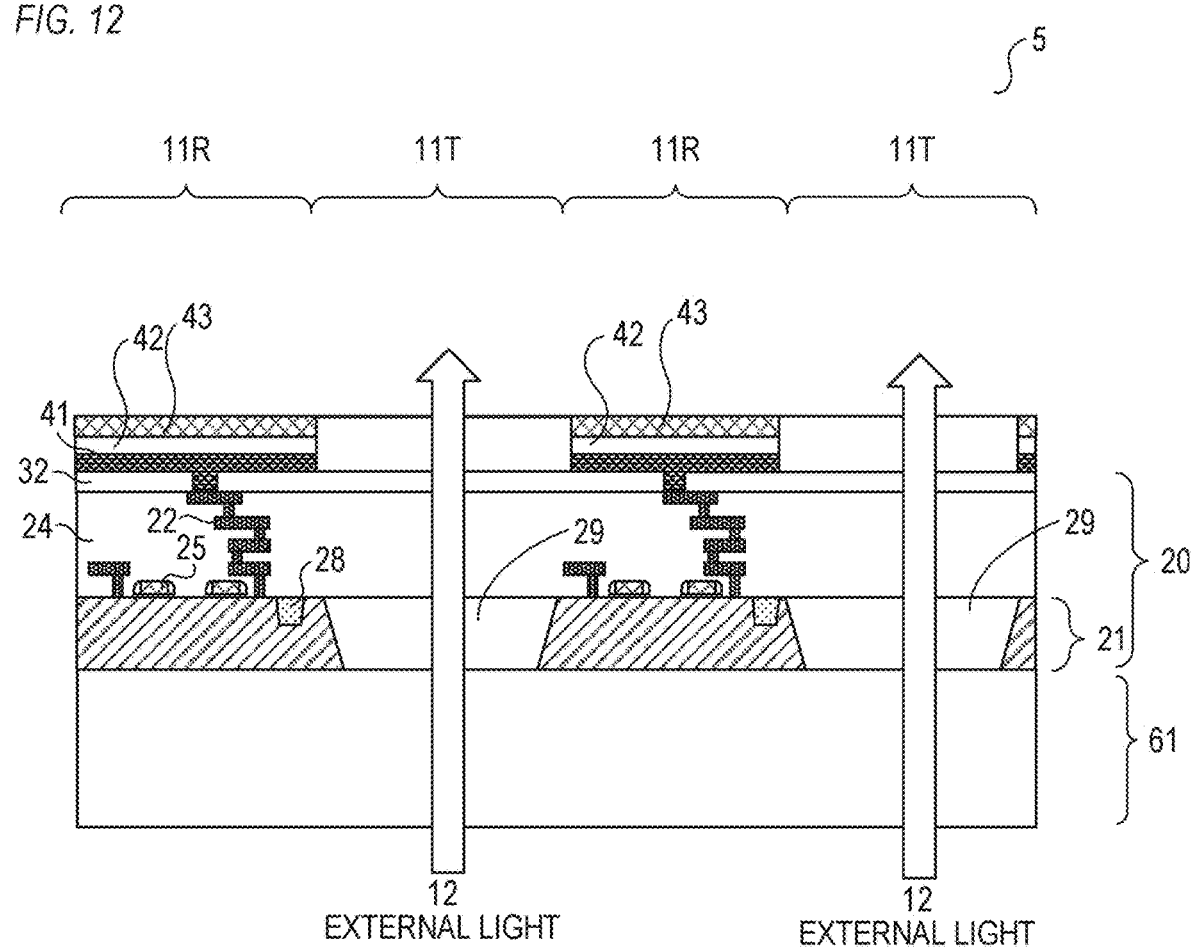
FIG. 12 is an example of a cross-sectional view of a display device according to a fifth embodiment.

A description will be given below of a fifth embodiment of the present invention. FIG. 12 is a cross-sectional view of a display device 5 according to the fifth embodiment. The fifth embodiment uses the transparent substrate 61 instead of the second substrate 50 described in the first embodiment. As described in the fourth embodiment, as the transparent substrate 61, a substrate having a thermal expansion coefficient similar to that of a single-crystal silicon substrate, such as a sapphire substrate, is preferably used, but a typical glass substrate may also be used instead. To maintain a physical strength of the display device 5, the transparent substrate 61 is preferably thick. For example, a thickness of the transparent substrate 61 is preferably not less than 300 μm and not more than 2000 μm. In the fifth embodiment, the first substrate 20 and the transparent substrate 61 are bonded together by, e.g., Si—SiO bonding.

Referring to FIGS. 1A, 13A, 13B, 14A, and 14B, a method of manufacturing the display device 5 will be described. FIGS. 13A, 13B, 14A, and 14B are cross-sectional views for illustrating an example of the method of manufacturing the display device 5.

Figure 13A:
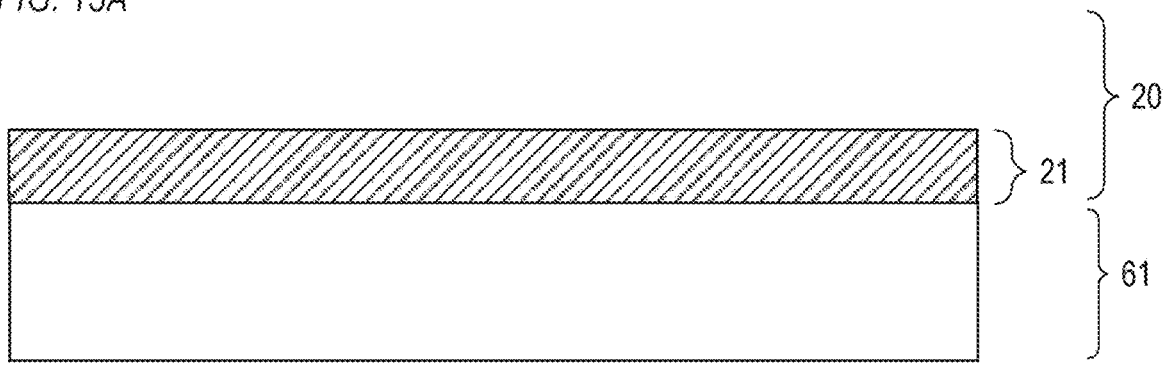
FIGS. 13A and 13B are cross-sectional views for illustrating an example of a method of manufacturing the display device according to the fifth embodiment.

First, as illustrated in FIG. 13A, the first semiconductor substrate 21 forming a part of the first substrate 20 and the transparent substrate 61 are prepared and bonded together by the Si—SiO bonding. The Si—SiO bonding can be achieved by anodic bonding, field-assisted bonding, or the like. It may also be possible to prepare a substrate in a state illustrated in FIG. 13A, such as a commercially available SOS (Silicon On Sapphire) substrate.

Figure 13B:
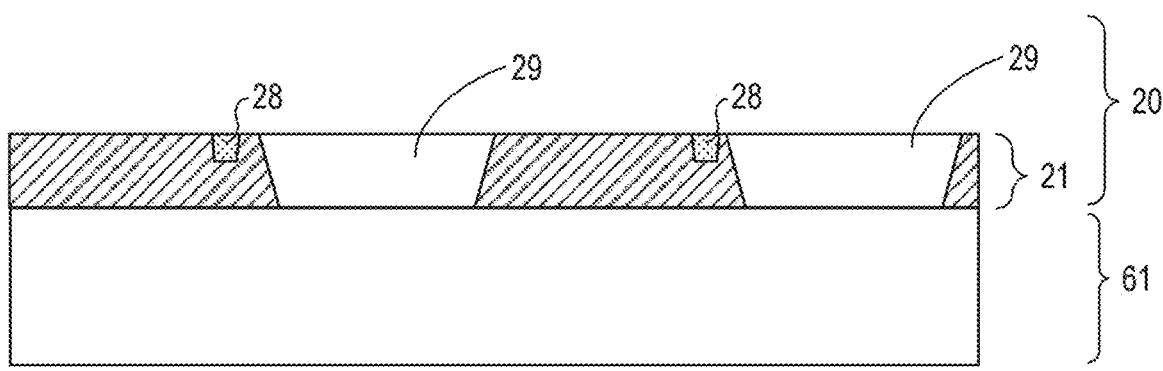

Next, as illustrated in FIG. 13B, in the portions of the first semiconductor substrate 21 serving as the light guiding portions 29, a plurality of holes are formed by etching to extend through the first semiconductor substrate 21. In addition, the STIs 28 are also formed in the first semiconductor substrate 21.

Figure 14A:
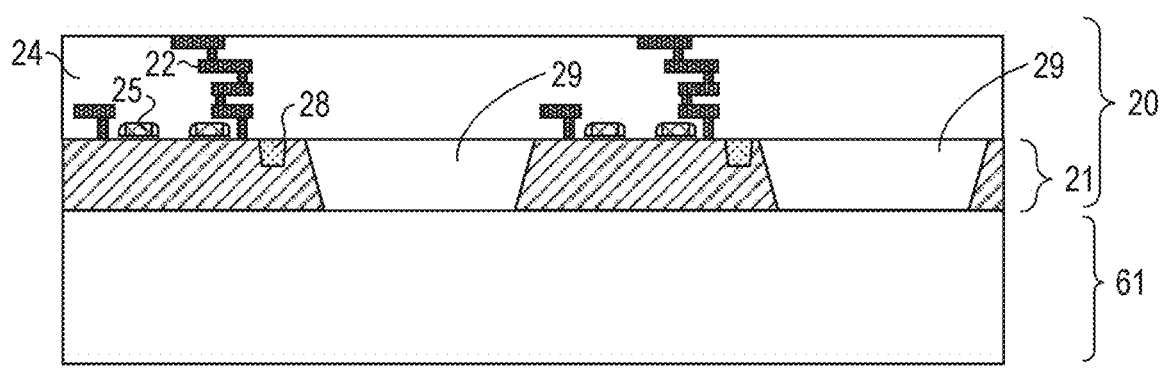
FIGS. 14A and 14B are cross-sectional views for illustrating the example of the method of manufacturing the display device according to the fifth embodiment.

Next, as illustrated in FIG. 14A, the MOS transistors including the gate electrodes 25, the metal wiring 22, and the interlayer insulating film 24 are formed. In the fifth embodiment, all of the drive transistor 112, the selection transistor 113, the switching transistor 114, and the switching transistor 115 in FIG. 3 correspond to each of the MOS transistors including the gate electrodes 25. In other words, all the drive circuits (the MOS transistors described above and the circuits on the peripheries thereof) that drive the sub-pixels 110 (the light emitting portions) are formed in the first semiconductor substrate 21.

Figure 14B:
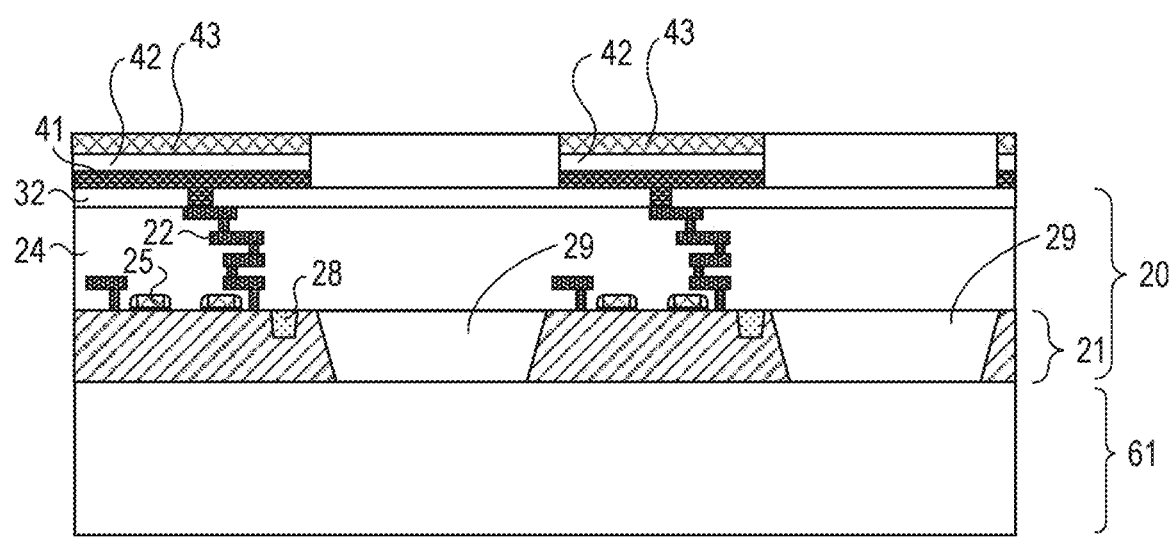

Next, as illustrated n FIG. 14B, the insulating film 32, the lower electrode 41, the organic EL film 42, and the upper electrode 43 are formed. The lower electrode 41, the organic EL film 42, and the upper electrode 43 are kept from being formed over the light guiding portions 29 by patterning. In the fifth embodiment, the light emitting portions are provided over the first semiconductor substrate 21 with the interlayer insulating film 24, the insulating film 32, and the like being interposed therebetween.

Then, in the same manner as in the step described with reference to FIG. 1A in the first embodiment, the color filters and the like are formed. Note that, as described in the first embodiment, the color filters need not necessarily be formed, and a monochrome display device may also be manufactured as the display device 5.

Sixth Embodiment

Figure 15:
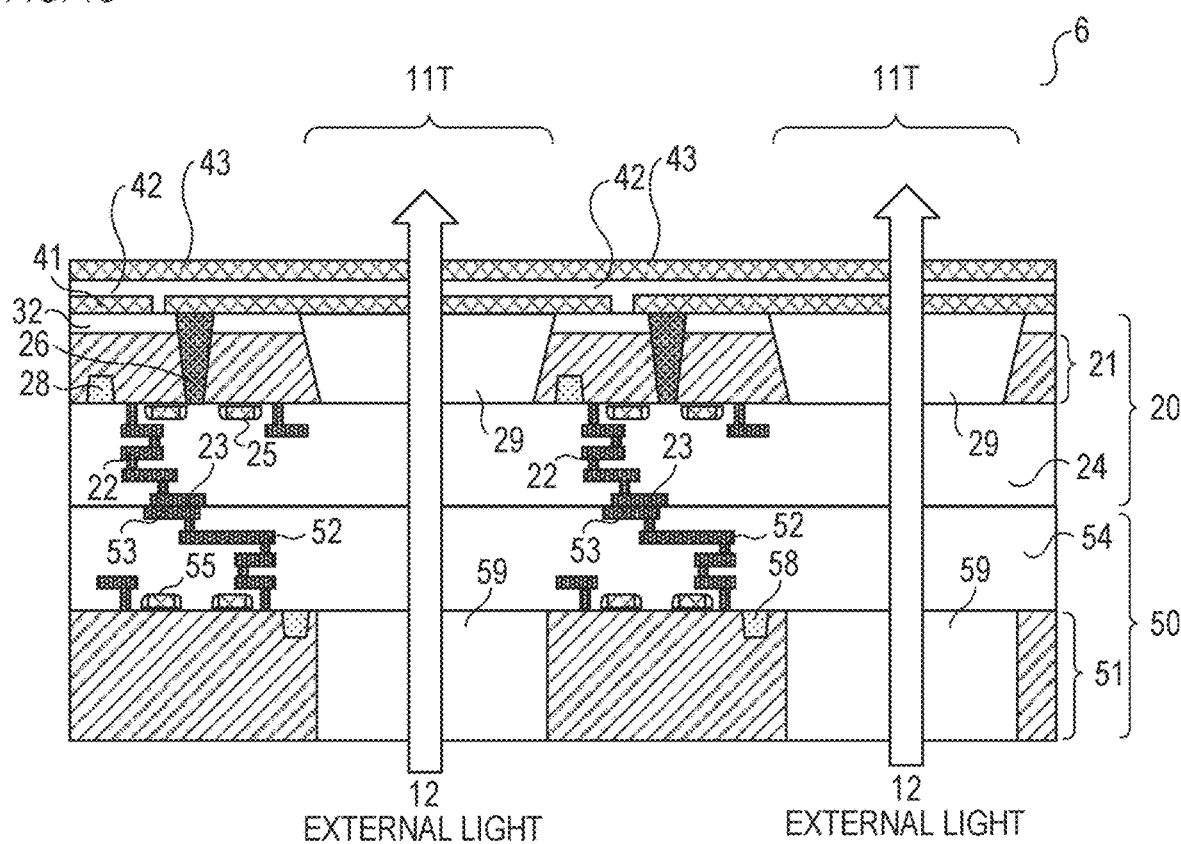
FIG. 15 is an example of a cross-sectional view of a display device according to a sixth embodiment.

A description will be given below of a sixth embodiment of the present invention. FIG. 15 is a cross-sectional view of a display device 6 according to the sixth embodiment. The display device 6 is a modification of the display device 1 described in the first embodiment. Since the organic EL film 42 is transparent, the organic EL film 42 is formed in a range including a space above the light guiding portions 29. Thus, a part of the plurality of light emitting portions is arranged on the light guiding portion 29. In addition, the light transmitting portions 11T also emit light. Accordingly, the lower electrode 41 is formed of the transparent electrode. Since the color filters are not used, the display device 6 may be either a color display device or a monochrome display device. For example, when the light beams emitted from the organic EL film 42 in the plurality of light emitting portions are in different colors, the display device 6 serves as the color display device and, when the light beams from the organic EL film 42 in all the plurality of light emitting portions are in white color, the display device 6 serves as the monochrome display device.

First Usage Example

Figure 16:
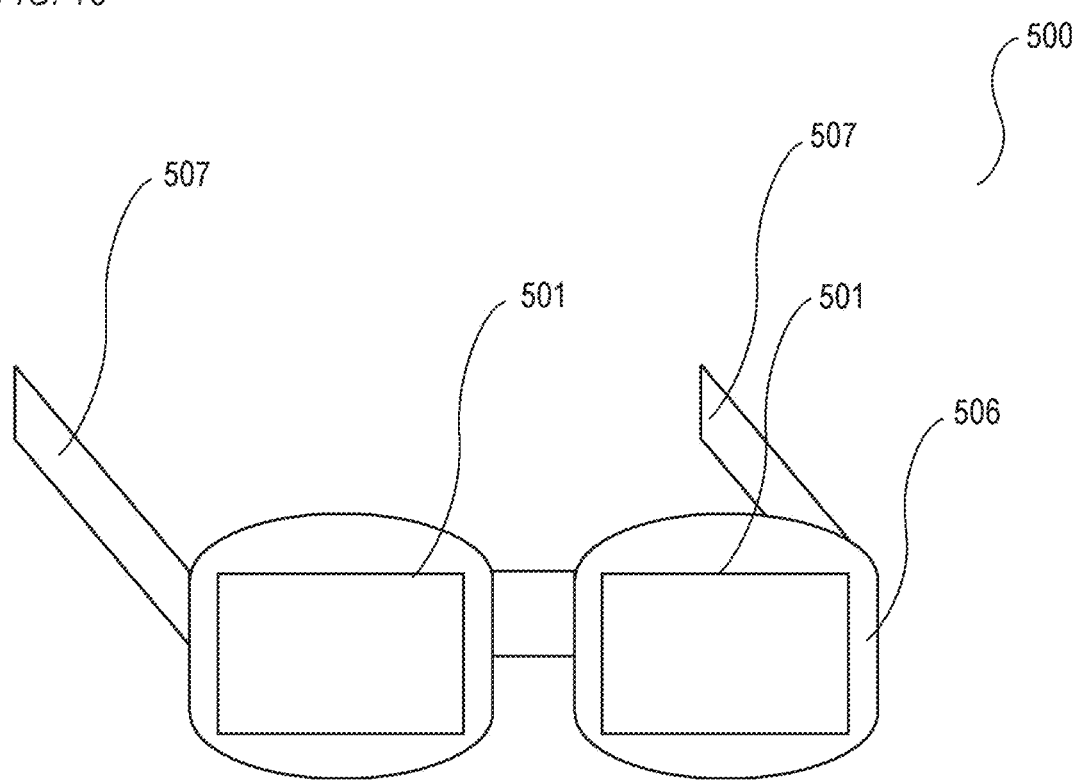
FIG. 16 is an example of an external view of smart glasses according to a first usage example.

The display device according to each of the embodiments described above may be a single independent display device, but is applicable to various devices. A description will be given below of an example in which the display device according to each of the embodiments described above is used for smart glasses (eyeglasses) as a first usage example of the display device. FIG. 16 is an external view of smart glasses 500 using a display device 501 according to each of the embodiments described above. The display device 501 is used in each of lens portions of the smart glasses 500. In FIG. 16, the entire lens portion is formed of the display device 501, but it may also be possible that a part of the lens portion is formed of the display device 501. Each of the lens portions (display device 501) is held by a frame of the smart glasses 500. Specifically, the frame includes a rim 506 and temples (eyeglass temples) 507, and each of the lens portions (the display device 501) is held by the rim 506.

The display device 501 is a see-through display device. Accordingly, even when a user wears the smart glasses 500 to place the display device 501 in front of his or her eye, the user can see a real image (such as scenery) beyond the display device 501 in the same manner as when the user wears normal eyeglasses or sunglasses. The user can also see an image displayed on the display device 501. The image displayed on the display device 501 is visually recognized as if superimposed on the real image.

The smart glasses 500 do not use half mirrors or prisms, and can therefore be lightweight. In addition, in the display device 501, the drive circuits of the light emitting portions are formed in the single-crystal semiconductor substrate, and therefore such effects as a high display resolution, high-speed processing and responses, low power consumption, and small variations in pixel brightness and chromaticity are obtainable.

Second Usage Example

Figure 17:
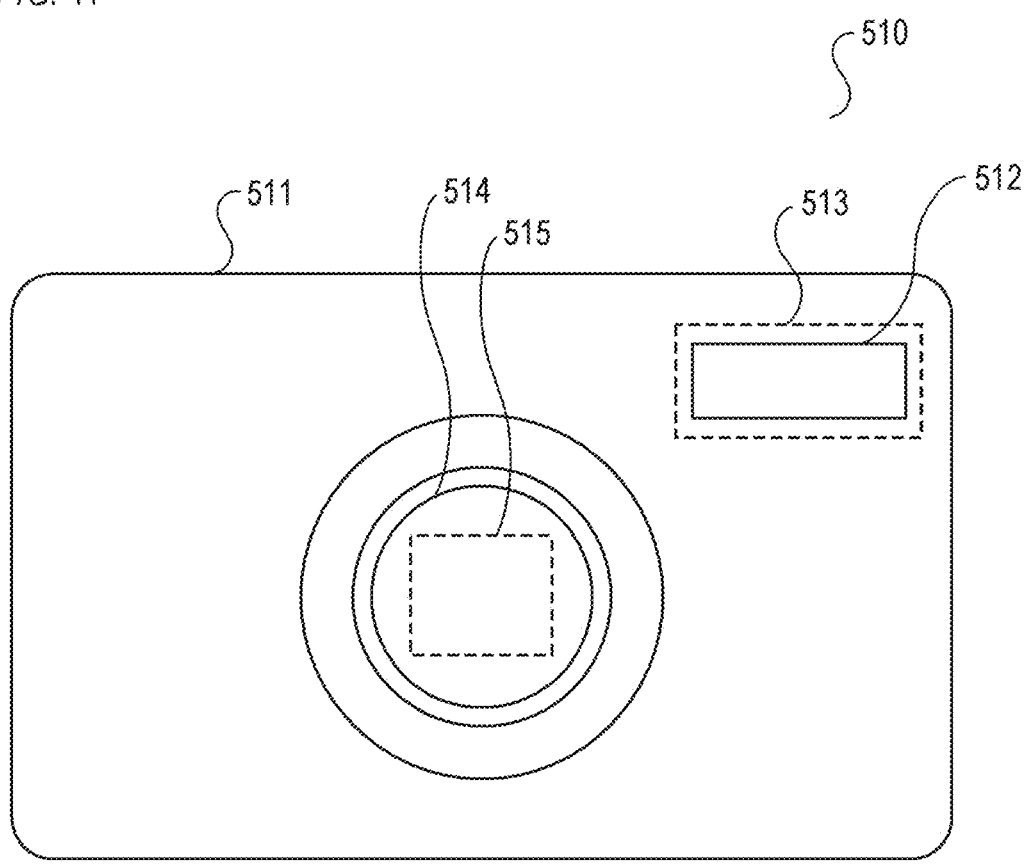
FIG. 17 is an example of an external view of a camera according to a second usage example.

A description will be given of an example in which the display device according to each of the embodiments described above is used for a camera (a viewfinder of the camera) as a second usage example of the display device. FIG. 17 is an external view of a camera 510 (imaging device) using a display device 513 according to each of the embodiments described above. For example, when performing photographing, a user holds a housing 511, and looks through a viewfinder 512. In the viewfinder 512, the display device 513 is embedded. Light from an object passes through an imaging lens 514 to be incident on an imaging sensor 515 in the camera 510 and converted to an electric signal (image signal) through photoelectric conversion by the imaging sensor 515. For example, the imaging sensor 515 is a CMOS area sensor. Note that the camera 510 may be a camera from which a lens unit including the imaging lens 514 is detachable, or may also be a camera with which the lens unit and a camera main body are integrated.

It is assumed herein that the viewfinder 512 is an optical viewfinder (OVF). The display device 513 is a see-through display device. Accordingly, even though the display device 513 is placed in front of an eye of the user when the user looks through the viewfinder 512, the user can recognize a real image (an object) beyond the display device 513 in the same manner as when the user looks through a normal OVF. The user can also see an image displayed on the display device 513. The image displayed on the display device 513 is visually recognized as if superimposed on the real image.

Note that, in response to an operation by the user, the viewfinder 512 may also be switchable between the optical viewfinder (OVF) and an electronic viewfinder (EVF). For example, as long a space between the display device 513 and the object is not blocked, the viewfinder 512 can be used as the OVF. Meanwhile, when the space between the display device 513 and the object is blocked and an image (image captured by the imaging sensor 515) based on the image signal output from the imaging sensor 515 is displayed on the display device 513, the viewfinder 512 can be used as the EVF.

The viewfinder 512 does not use half mirrors or prisms, and can therefore be lightweight. It is also possible to reduce a volume occupied by the viewfinder 512 in the camera 510. In addition, in the display device 513, the drive circuits of the light emitting portions are formed in the single-crystal semiconductor substrate, and therefore such effects as a high display resolution, high-speed processing and responses, low power consumption, and small variations in pixel brightness and chromaticity are obtainable.

Third Usage Example

Figure 18A:
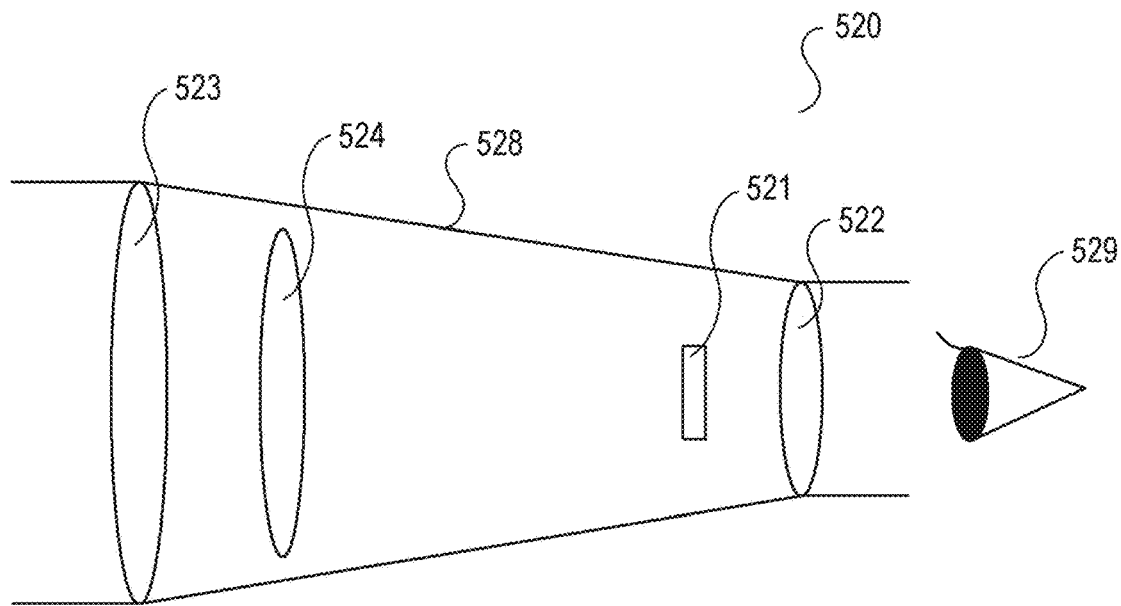
FIGS. 18A and 18B are examples of a cross-sectional view of a telescope according to a third usage example.
Figure 18B:
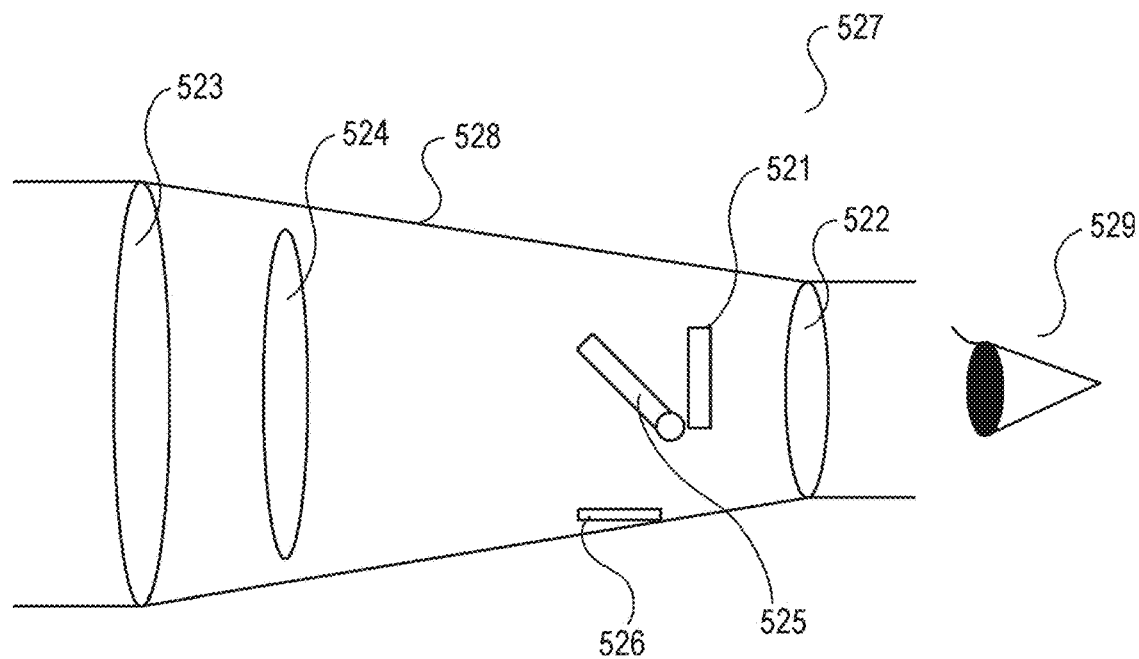

A description will be given of an example in which the display device according to each of the embodiments described above is used for telescopes as a third usage example of the display device. FIGS. 18A and 18B are cross-sectional views of telescopes 520 and 527 each using a display device 521 according to each of the embodiments described above. The telescope 520 in FIG. 18A is a telescope not having a camera function, while the telescope 527 in FIG. 18B is a telescope having the camera function.

In a housing 528 of each of the telescopes 520 and 527, an ocular lens 522, an intermediate lens 524, and an objective lens 523 are arranged in order of increasing distance from an eye 529 of a user looking through the telescope 520. The display device 521 is provided between the ocular lens 522 and the objective lens 523, specifically between the ocular lens 522 and the intermediate lens 524.

The display device 521 is a see-through display device. Accordingly, even though the display device 521 is placed in front of the eye 529 of the user when the user looks through the telescope 520 or the telescope 527, the user can see a real image (an object to be observed) beyond the display device 521 in the same manner as when the user looks through a normal telescope. The user can also see an image displayed on the display device 521. The image displayed on the display device 521 is visually recognized as if superimposed on the real image. For example, when looking through the telescope 520 or the telescope 527 to see a mountain, the user can see a real image of the mountain and can also see, as the image displayed on the display device 521, an image representing information such as a name of the mountain and directions.

In the housing 528 of the telescope 527 (the telescope having the camera function) in FIG. 18B, a movable mirror 525 and an imaging sensor 526 are also arranged. For example, the imaging sensor 526 is a CMOS area sensor. When the movable mirror 525 is in a position in which the movable mirror 525 does not block a space between the objective lens 523 and the display device 521, the user can see the real image (the object to be observed) beyond the display device 521 and the image displayed on the display device 521. When the movable mirror 525 is in a position in which the movable mirror 525 blocks the space between the objective lens 523 and the display device 521 and guides light from the objective lens 523 to the imaging sensor 526, it is possible to use the imaging sensor 526 to image the object to be observed. The image obtained as a result of the imaging can be stored on a recording medium (photographing of the object to be observed). The user can also see the image displayed on the display device 521. The user can operate the telescope 527 to switch between the real image and the image to check the real image or the image and photograph the object to be observed. Note that, instead of the movable mirror 525, a stationary half mirror may also be used.

MODIFICATIONS/CHANGES/COMBINATIONS

Note that the embodiments described above are only exemplary. Configurations obtained by appropriately modifying or changing the configurations in the embodiments described above within the scope of the gist of the present invention are also included in the present invention. Likewise, the usage examples described above are only exemplary, and configurations obtained by appropriately modifying or changing the configurations in the usage examples described above within the scope of the gist of the present invention are also included in the present invention. Configurations obtained by appropriately combining the configurations in the embodiments described above, the configurations in the usage examples described above, and the like are also included in the present invention.

According to the present invention, it is possible to provide a see-through display device which allows pixel miniaturization, another device (such as eyeglasses or a camera) including the display device, and a method of manufacturing the display device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-155255, filed on Sep. 24, 2021, which is hereby incorporated by reference herein in its entirety.

What is claimed is:

1. A display device comprising:
a first substrate including a first single-crystal semiconductor substrate provided with a plurality of light emitting portions and with a first drive circuit that drives the plurality of light emitting portions; and
a second substrate including a second single-crystal semiconductor substrate provided with a second drive circuit that drives the plurality of light emitting portions,
wherein the first single-crystal semiconductor substrate includes a plurality of light guiding portions that transmit light so as to implement a see-through function,
wherein a surface of the first substrate opposite to a surface thereof provided with the plurality of light emitting portions is bonded to the second substrate, and
wherein the second substrate includes a light guiding portion that transmits light so as to implement the see-through function.

2. The display device according to claim 1, wherein the plurality of light guiding portions are arranged in a region where the plurality of light emitting portions are arranged.

3. The display device according to claim 1, wherein the plurality of light emitting portions are arranged so that a plurality of pixels, each including the one or more light emitting portions, are arranged, and
wherein the plurality of light guiding portions are arranged so that the plurality of light guiding portions correspond to the plurality of pixels on a one-to-one basis.

4. The display device according to claim 3, wherein the plurality of pixels, each including a combination of the light emitting portion that emits red light, the light emitting portion that emits green light, and the light emitting portion that emits blue light, are arranged.

5. The display device according to claim 3, wherein a pitch between the plurality of pixels is not more than 30 µm.

6. The display device according to claim 1, wherein a pitch between the plurality of light guiding portions is not more than 30 µm.

7. The display device according to claim 1, wherein the plurality of light emitting portions and the plurality of light guiding portions are arranged in a square arrangement or in a delta arrangement.

8. The display device according to claim 1, wherein, when viewed in a direction perpendicular to a surface of the first substrate that is a surface provided with the plurality of light emitting portions, the light guiding portion is larger in size than the light emitting portion.

9. The display device according to claim 1, wherein a thickness of the first single-crystal semiconductor substrate is not less than 2 µm and not more than 30 µm.

10. The display device according to claim 1, wherein the first single-crystal semiconductor substrate is a single-crystal silicon substrate.

11. The display device according to claim 1, wherein a part of the plurality of light emitting portions is arranged on the light guiding portion.

12. The display device according to claim 1, wherein, when viewed in a direction perpendicular to a surface of the first substrate that is a surface provided with the plurality of light emitting portions, a width of the light guiding portion is not less than 2 µm and not more than 28 µm.

13. The display device according to claim 1, wherein the second single-crystal semiconductor substrate includes one light guiding portion corresponding to an entire region where the plurality of light emitting portions are arranged.

14. The display device according to claim 1, wherein the second single-crystal semiconductor substrate includes a plurality of light guiding portions each corresponding to the two or more light emitting portions.

15. The display device according to claim 1, wherein the plurality of light emitting portions are arranged so that a plurality of pixels, each including the one or more light emitting portions, are arranged, and wherein the second single-crystal semiconductor substrate includes a plurality of light guiding portions corresponding to the plurality of pixels on a one-to-one basis.

16. The display device according to claim 1, wherein the light emitting portion is a light emitting diode or an organic light emitting diode.

17. Eyeglasses comprising:
a lens portion including the display device according to claim 1; and
a frame holding the lens portion.

18. A camera comprising:
an imaging sensor; and
a finder including the display device according to claim 1.

19. A method of manufacturing a display device, the method comprising:
preparing a first substrate including a first single-crystal semiconductor substrate provided with a first drive circuit that drives a plurality of light emitting portions;
preparing a second substrate including a second single-crystal semiconductor substrate provided with a second drive circuit that drives the plurality of light emitting portions;
forming a light guiding portion that transmits light in the second single-crystal semiconductor substrate so as to implement a see-through function;
bonding a surface of the first substrate opposite to a surface thereof to be provided with the plurality of light emitting portions to the second substrate;
forming a plurality of light guiding portions that transmit light in the first single-crystal semiconductor substrate so as to implement the see-through function; and
forming the plurality of light emitting portions in the first single-crystal semiconductor substrate.

20. The method of manufacturing the display device according to claim 19, further comprising:
thinning the first single-crystal semiconductor substrate before forming the plurality of light guiding portions in the first single-crystal semiconductor substrate.

* * * * *